United States Patent
Ulusoy et al.

(10) Patent No.: US 10,585,997 B1
(45) Date of Patent: Mar. 10, 2020

(54) AUTOMATIC GROUPING OF SIGNALS OF A MODEL

(71) Applicant: The MathWorks, Inc., Natick, MA (US)

(72) Inventors: Mehmet Alphan Ulusoy, Medford, MA (US); Kaushik Krishnasamy, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 651 days.

(21) Appl. No.: 15/060,019

(22) Filed: Mar. 3, 2016

Related U.S. Application Data

(60) Provisional application No. 62/128,342, filed on Mar. 4, 2015.

(51) Int. Cl.
*G06F 17/50* (2006.01)

(52) U.S. Cl.
CPC ................ *G06F 17/5036* (2013.01)

(58) Field of Classification Search
CPC .................................................. G06F 17/5036
USPC ............................................................. 703/17
See application file for complete search history.

(56) References Cited

U.S. PATENT DOCUMENTS

| | | | | |
|---|---|---|---|---|
| 6,571,282 B1 * | 5/2003 | Bowman-Amuah | ...................... | H04L 67/303 709/219 |
| 7,274,332 B1 * | 9/2007 | Dupray | .................... | G01S 19/45 342/357.64 |
| 7,424,410 B2 * | 9/2008 | Orofino, II | ................ | G06F 8/34 703/2 |
| 7,433,812 B2 * | 10/2008 | Shakeri | .................. | G05B 17/02 345/594 |
| 7,487,076 B2 * | 2/2009 | Szpak | ................. | G06F 17/5009 703/14 |
| 7,490,032 B1 * | 2/2009 | Koh | ..................... | G06F 17/5009 703/22 |
| 7,823,121 B1 * | 10/2010 | Zarrinkoub | ............... | G06F 8/34 715/763 |
| 8,046,201 B1 * | 10/2011 | Pike | ........................ | G06F 9/451 703/6 |
| 8,196,056 B2 * | 6/2012 | Ciolfi | ........................ | G06F 8/34 715/771 |
| 8,204,732 B1 * | 6/2012 | Simsek | ..................... | G06F 8/34 703/16 |

(Continued)

OTHER PUBLICATIONS

Mike Whalen ("Why We Model: Using MBD Effectively in Critical Domains", University of Minnesota, 2013, pp. 1-50).*

(Continued)

*Primary Examiner* — Brian S Cook
*Assistant Examiner* — Iftekhar A Khan
(74) *Attorney, Agent, or Firm* — Young Basile Hanlon & MacFarlane, P.C.

(57) ABSTRACT

A device receives a selection of signals associated with a model, and analyzes the selected signals to identify signals, of the selected signals, that can be grouped into a semantically viable aggregation. The device receives an instruction to create a block for the identified signals. The device provides a block to group the identified signals into a semantically viable aggregation with a particular number of inputs, a particular number of outputs, a particular size, a particular position, and a particular orientation, in relation to the model, based on the identified signals, and provides the block in the model.

32 Claims, 24 Drawing Sheets

(56) References Cited

U.S. PATENT DOCUMENTS

| | | | | |
|---|---|---|---|---|
| 8,522,215 B1* | 8/2013 | Aldrich | G06F 8/10 | 702/182 |
| 8,620,629 B1* | 12/2013 | Li | H04L 41/06 | 703/2 |
| 8,812,283 B1* | 8/2014 | Li | G06Q 10/04 | 703/13 |
| 9,003,360 B1* | 4/2015 | Feng | G06F 8/35 | 717/105 |
| 9,064,075 B1* | 6/2015 | Popovici | G06F 17/5054 | |
| 9,098,292 B1* | 8/2015 | Zhang | G06F 8/35 | |
| 9,268,537 B1* | 2/2016 | Zhang | G06F 8/35 | |
| 9,280,382 B1* | 3/2016 | Stefansson | G06F 15/8023 | |
| 9,542,164 B1* | 1/2017 | Mosterman | G06F 8/71 | |
| 2004/0215742 A1* | 10/2004 | Cook | H04N 1/00204 | 709/217 |
| 2006/0139372 A1* | 6/2006 | Orofino, II | G06T 11/60 | 345/629 |
| 2008/0052425 A1* | 2/2008 | Orofino, II | G06F 17/5009 | 710/52 |
| 2009/0193391 A1* | 7/2009 | Miller | G06F 11/3672 | 717/105 |
| 2010/0153910 A1* | 6/2010 | Ciolfi | G06F 8/34 | 717/105 |
| 2010/0175045 A1* | 7/2010 | Ciolfi | G06F 8/34 | 717/105 |
| 2011/0173235 A1* | 7/2011 | Aman | A63B 24/0021 | 707/792 |
| 2012/0254827 A1* | 10/2012 | Conrad | G06F 8/35 | 717/104 |
| 2012/0254830 A1* | 10/2012 | Conrad | G06F 11/3604 | 717/106 |
| 2012/0266129 A1* | 10/2012 | Massoudi | G06F 8/31 | 717/105 |
| 2013/0080130 A1* | 3/2013 | Behr | G06F 8/10 | 703/6 |
| 2013/0080140 A1* | 3/2013 | Behr | G06F 8/10 | 703/21 |
| 2013/0085740 A1* | 4/2013 | Booch | G06F 17/5009 | 703/17 |
| 2013/0198713 A1* | 8/2013 | Zhang | G06F 8/10 | 717/106 |
| 2014/0157052 A1* | 6/2014 | Campbell | G06F 11/3672 | 714/32 |
| 2014/0157236 A1* | 6/2014 | Campbell | G06F 11/3684 | 717/124 |
| 2014/0280952 A1* | 9/2014 | Shear | H04L 47/70 | 709/226 |
| 2014/0359568 A1* | 12/2014 | Avadhanula | G06F 8/35 | 717/109 |
| 2014/0359569 A1* | 12/2014 | Avadhanula | G06F 8/35 | 717/109 |
| 2014/0359580 A1* | 12/2014 | Boissy | G06F 11/3664 | 717/125 |
| 2015/0293512 A1* | 10/2015 | Egge | G06F 17/5036 | 703/2 |
| 2016/0034305 A1* | 2/2016 | Shear | G06F 16/245 | 707/722 |
| 2017/0171580 A1* | 6/2017 | Hirsch | H04N 21/252 | |
| 2017/0351791 A1* | 12/2017 | Manoj Gangadhar | G06F 17/5009 | |

OTHER PUBLICATIONS

Whalen et al. ("Observable Modified Condition/Decision Coverage", IEEE, 2013, pp. 102-111).*

Whalen et al. (Observable Modified Condition/Decision Coverage, IEEE, 2013, pp. 102-111) (Year: 2013).*

Long et al., co-pending U.S. Appl. No. 14/635,719, entitled "Exchanging Information Among System Middleware and Models", filed Mar. 2, 2015, 64 pages.

Shakeri et al., co-pending U.S. Appl. No. 15/298,019, entitled "Port Management for Graphical Modeling", filed Oct. 19, 2016, 72 pages.

OMG: Object Management Group, "Common Object Request Broker Architecture (CORBA)," http://www.omg.org/spec/CORBA/3.3/, Nov. 12, 2012, 532 pages.

Forwardsim: simulations & technologies, "HLA Blockset: The Simulink interface to HLA," Mar. 2014, 2 pages.

OMG: Object Management Group, "Data Distribution Service for Real-time Systems," Jul. 1, 2001, 260 pages.

OSGi Alliance, "The OSGi Architecture," http://www.osgi.org/Technology/WhatIsOSGi, Aug. 13, 2008, 4 pages.

Xiong et al., "HLA Based Collaborative Simulation with MATLAB Seamlessly Embedded," International Journal of Machine Learning and Computing, vol. 2, No. 2, Apr. 2012, 8 pages.

Tutorialspoint, "UML 2.0—Overview," https://www.tutorialspoint.com/uml/uml_2_overview.htm, Feb. 20, 2009, 7 pages.

Wikipedia, "Composite structure diagram," https://en.wikipedia.org/wiki/Composite_structure_diagram, May 15, 2016, 2 pages.

University of Texas, "Polymorphism," http://www.cs.utexas.edu/~mitra/csSummer2012/cs312/lectures/interfaces.html, Nov. 26, 2003, 2 pages.

* cited by examiner

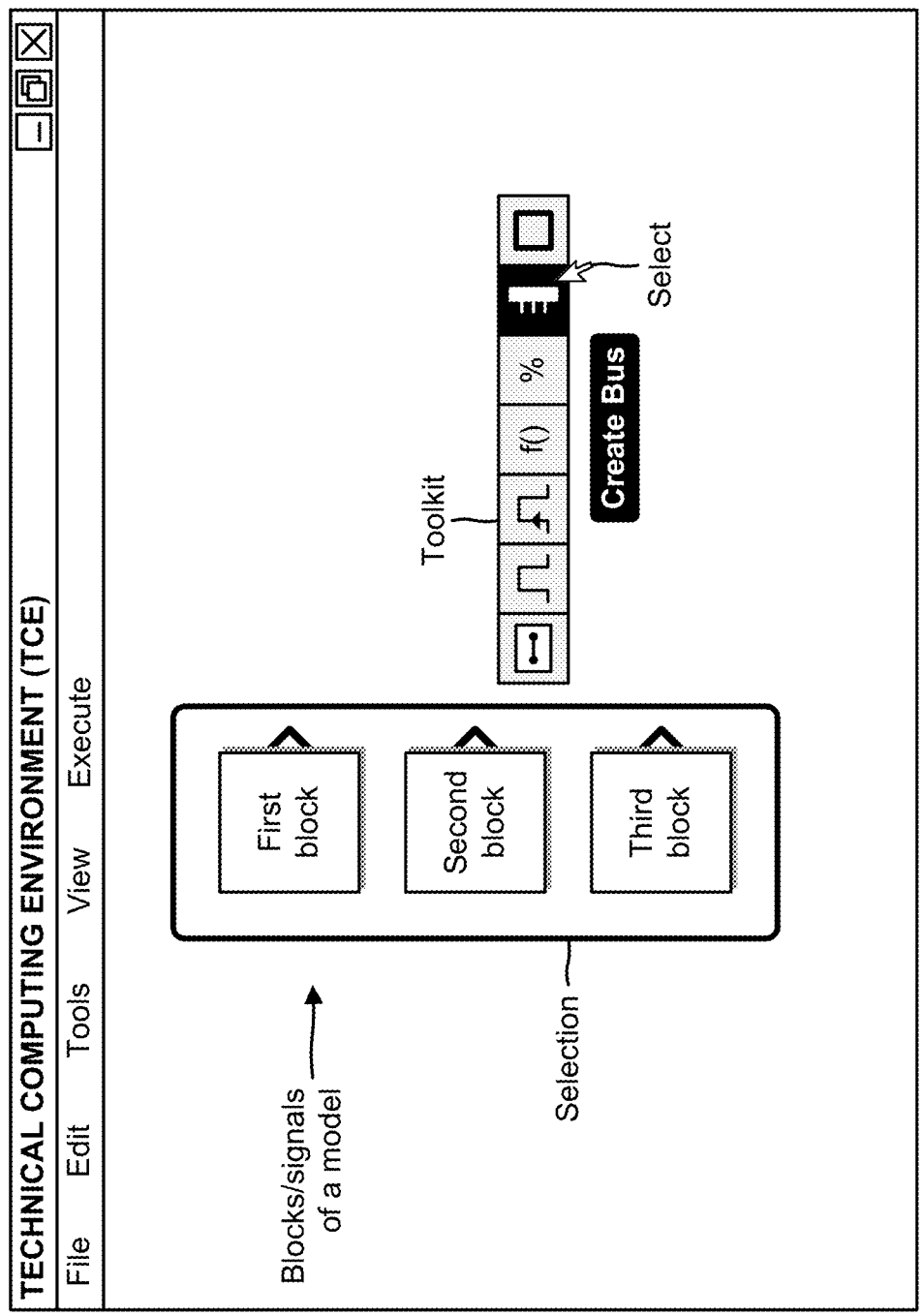

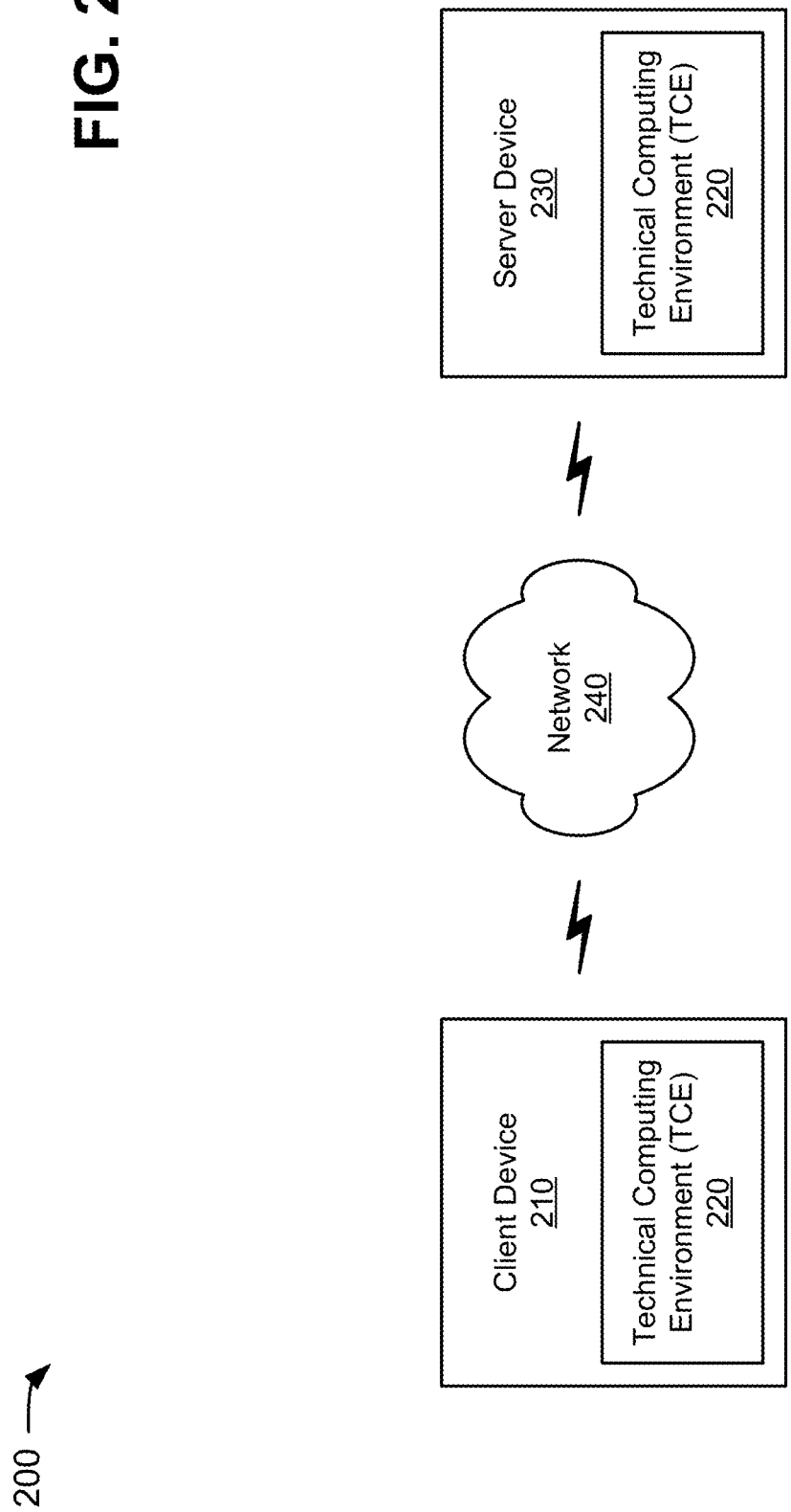

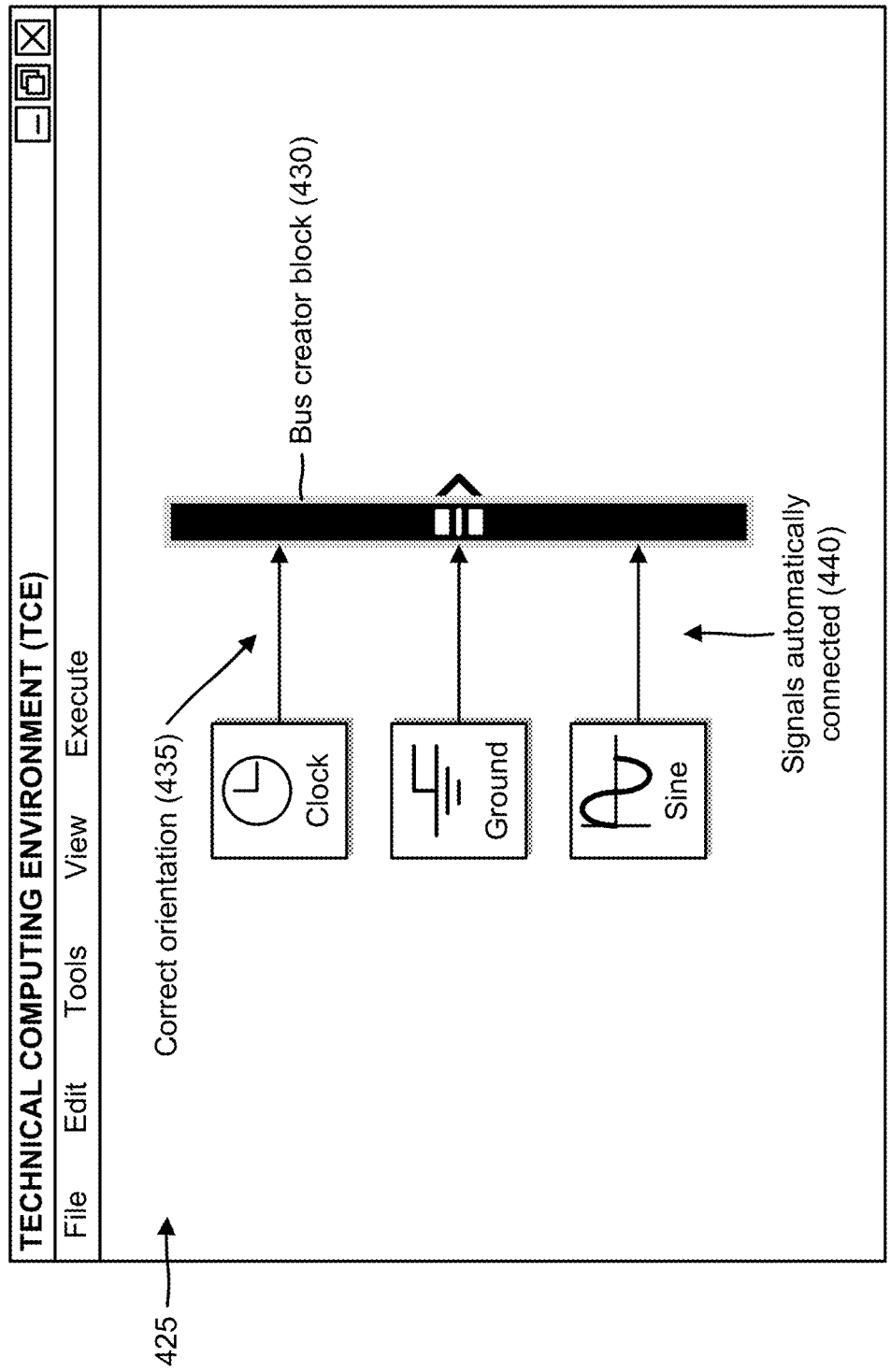

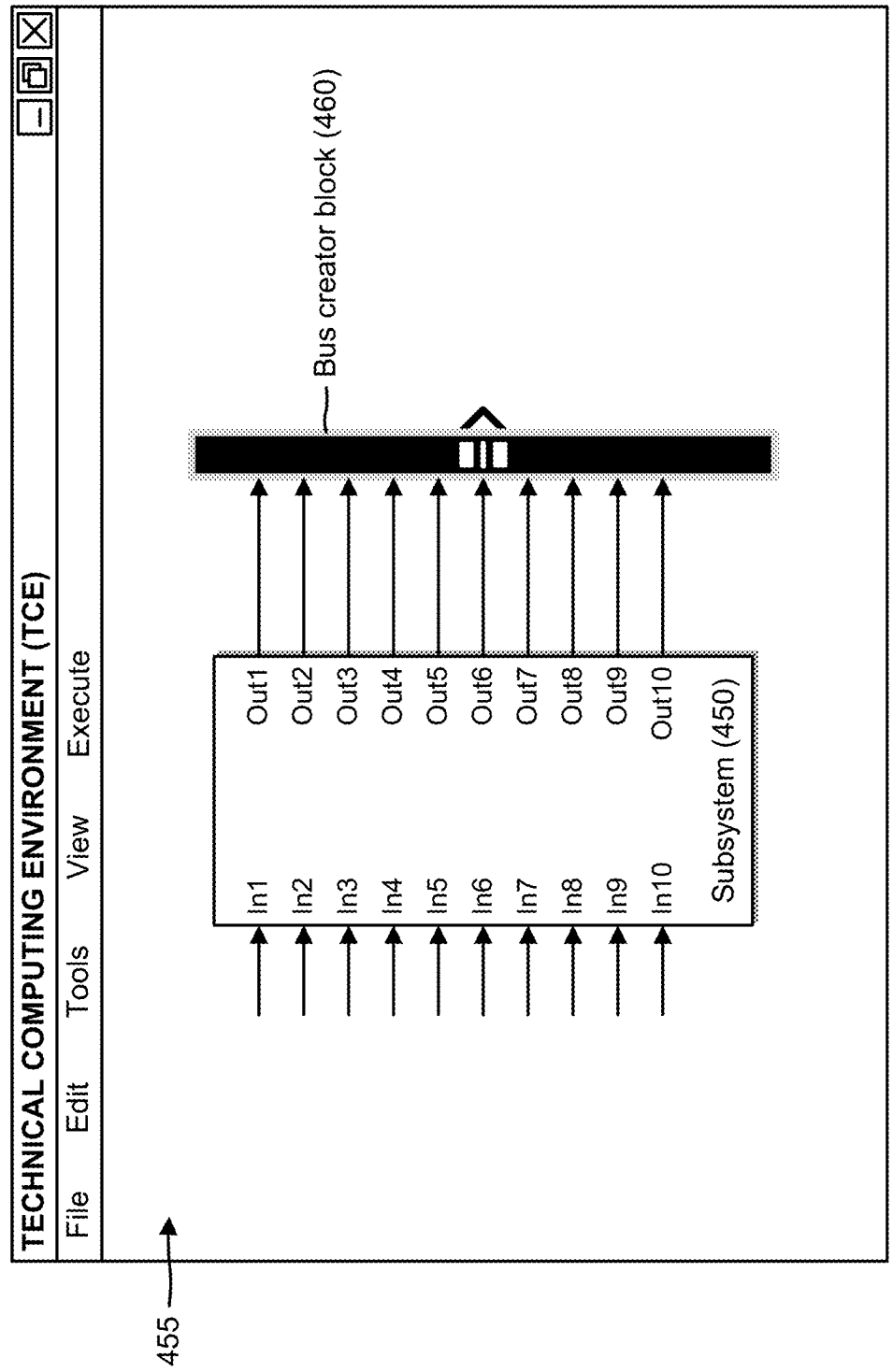

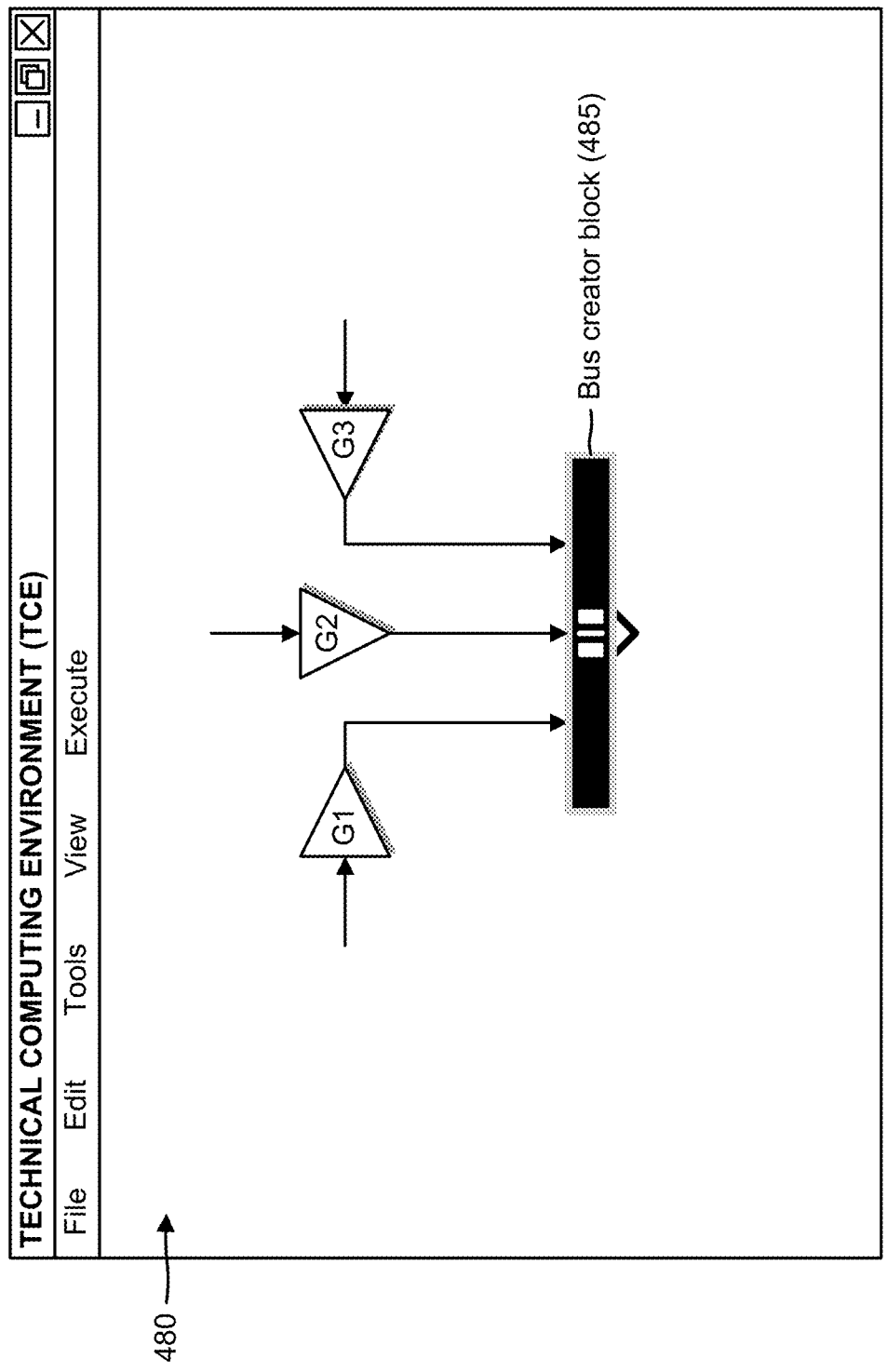

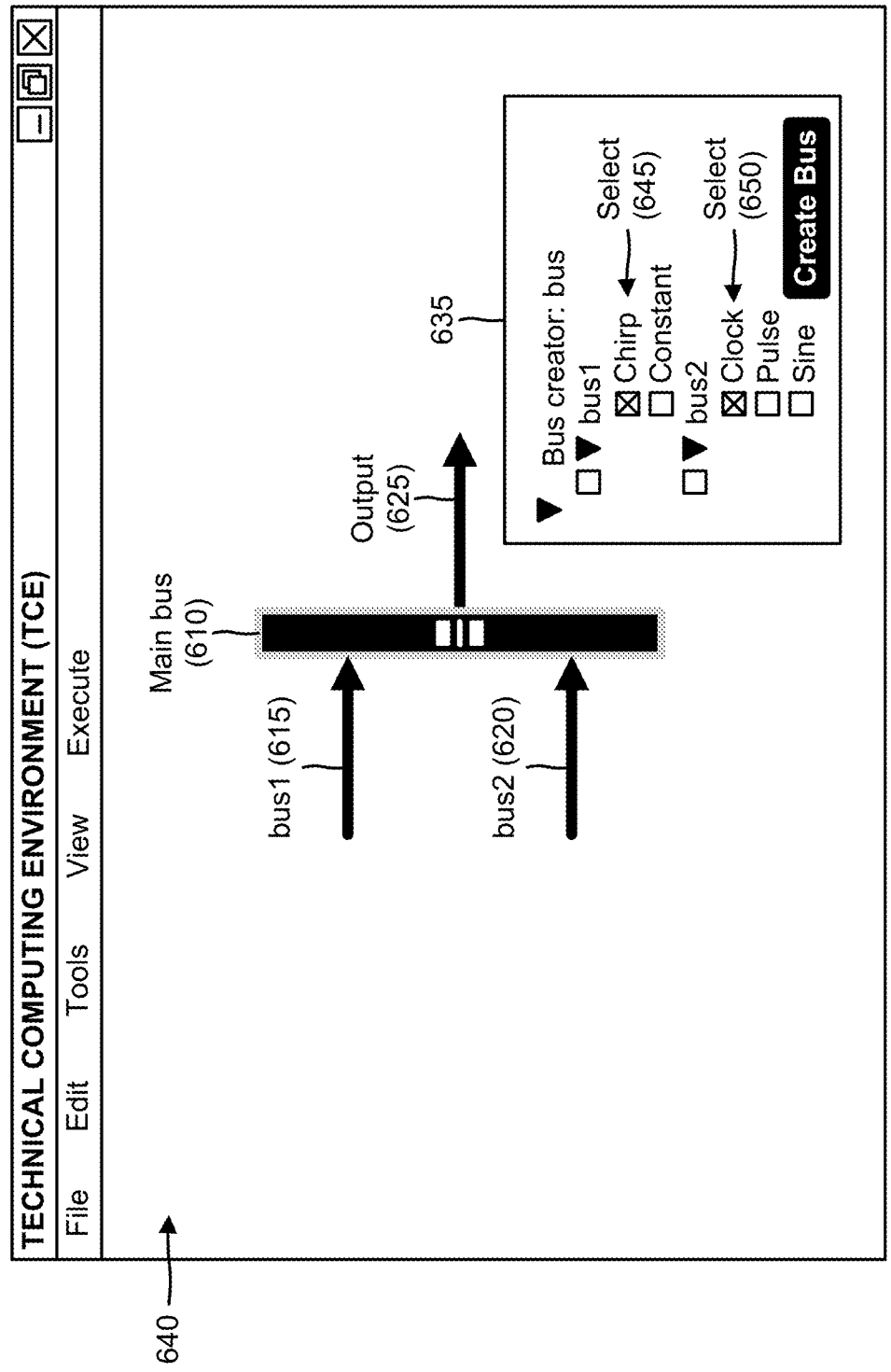

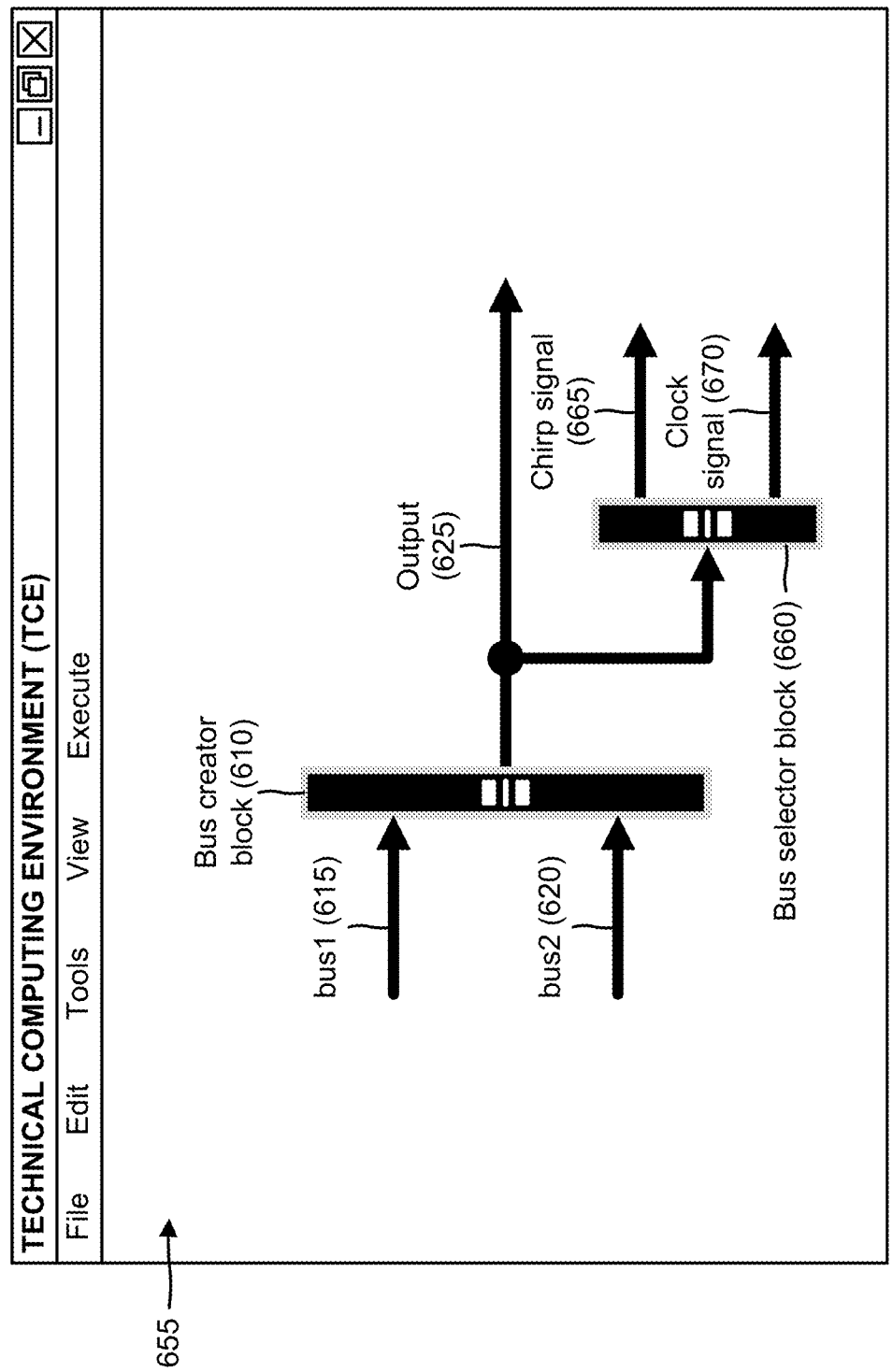

FIG. 7B

```
TECHNICAL COMPUTING ENVIRONMENT (TCE)
File  Edit  Tools  View  Execute function [dx, dy, dz] = changeInPos(oldX, oldY, oldZ)
    x = readX();                          Select (720)
    y = readY();
    z = readZ();                          Press "Enter" to group these variables ── 725
    dx = x - oldX;
    dy = y - oldY;                        ← Code (710)
    dz = z - oldZ;
end
```

```
TECHNICAL COMPUTING ENVIRONMENT (TCE)
File  Edit  Tools  View  Execute function [dx, dy, dz] = changeInPos(sIn)   ← 735
        x = readX();
        y = readY();
        z = readZ();
        dx = x - sIn.oLdX;    ← 740
        dy = y - sIn.oLdY;    ← 745
        dz = z - sIn.oLdZ;    ← 750
    end
```

← Code (710)

```
TECHNICAL COMPUTING ENVIRONMENT (TCE)
File  Edit  Tools  View  Execute

775
          ↓
      function [sOut] = changeInPos(sIN)
          x = readX();
          y = readY();
          z = readZ();
780 → sOut.dx = x - sIn.oldX;
785 → sOut.dy = y - sIn.oldY;
790 → sOut.dz = z - sIn.oldZ;
      end
```

← Code (710)

↑
770

700 →

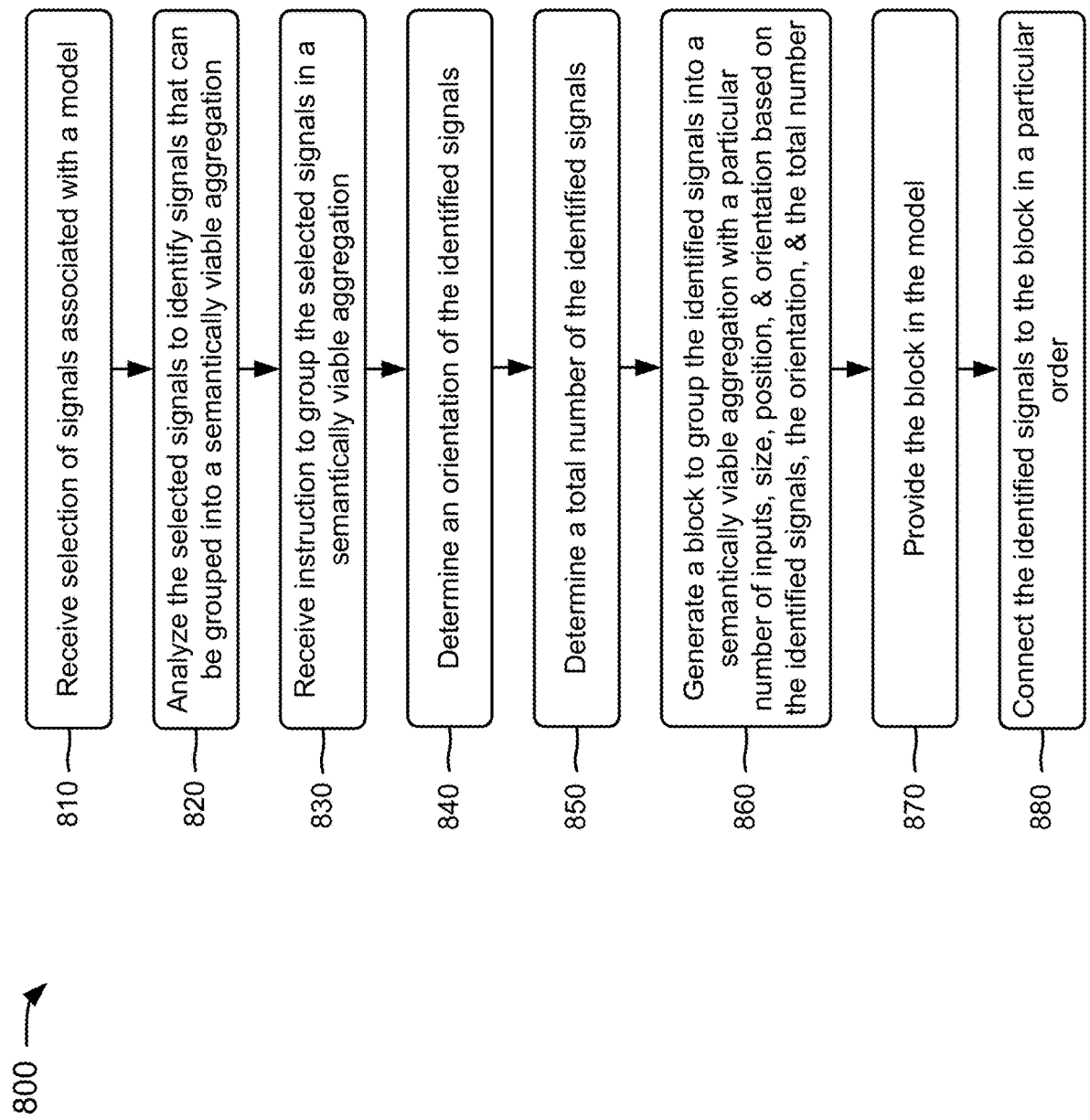

AUTOMATIC GROUPING OF SIGNALS OF A MODEL

RELATED APPLICATION

This application claims priority under 35 U.S.C. § 119 based on U.S. Provisional Patent Application No. 62/128,342, filed Mar. 4, 2015, the disclosure of which is incorporated by reference herein in its entirety.

BRIEF DESCRIPTION OF THE DRAWINGS

FIGS. 1A and 1B are diagrams of an overview of an example implementation described herein;

FIG. 2 is a diagram of an example environment in which systems and/or methods, described herein, may be implemented;

FIGS. 4A-4F are diagrams of an example implementation for automatically grouping signals of a model via buses;

FIGS. 6A-6D are diagrams of an example implementation for selecting signals from a main bus and automatically grouping the selected signals via a secondary bus;

FIGS. 7A-7E are diagrams of an example implementation for automatically grouping variables of textual code; and FIG. 8 is a flow chart of an example process for automatically grouping signals of a model into a semantically viable aggregation.

DETAILED DESCRIPTION

The following detailed description of example implementations refers to the accompanying drawings. The same reference numbers in different drawings may identify the same or similar elements.

A device, such as a computer, may receive or create a model of a system. The model may include a set of model elements that, when executed, simulates the behavior of the system. The model elements may correspond to the physical elements of the system and may, when executed, simulate the behavior of the physical elements. For example, the model may include a block diagram model with one or more blocks (e.g., model elements) that represent an operation of a component of the system. The blocks may be connected via one or more signal lines (e.g., lines for carrying a signal associated with the blocks). A parameter may describe the behavior of a block in the context of the block diagram model, and may influence a manner in which the block behaves, when executed.

In some cases, the signal lines (e.g., signals) may be grouped together in the model via a particular block to create an aggregation or collection. For example, assume that the model includes a clock signal and multiple sine wave signals that are to be combined. In such an example, a bus creator block (whose output is referred to herein as a bus) may be used to combine the clock signal and the multiple sine wave signals in a bus. However, to insert and connect the bus creator block in the model involves multiple manual steps, such as opening a library of blocks, dragging a bus creator block to the model from the library, editing the properties of the bus creator block, resizing and repositioning the bus creator block, and connecting the signals to the bus creator block. Such manual efforts involve an inordinate amount of time, reduce productivity, degrade user experience, and waste valuable computing resources.

Systems and/or methods, described herein, may automatically create a new block to group signals of a model into a semantically viable aggregation, and may automatically group signals of a model into a semantically viable aggregation. The systems and/or methods may reduce time, increase productivity, improve the user experience associated with grouping multiple signals into a semantically viable aggregation, and reduce computing resources (e.g., processing power) needed to group multiple signals into a semantically viable aggregation. The systems and/or methods may automate various tasks for grouping multiple signals in an aggregation, which require manual performance, and may eliminate context switches (e.g., opening a library of blocks, editing properties of the block that will be used to create the aggregation, the bus creator block, or the like) associated with grouping multiple signals into a semantically viable aggregation.

Figure 1B:
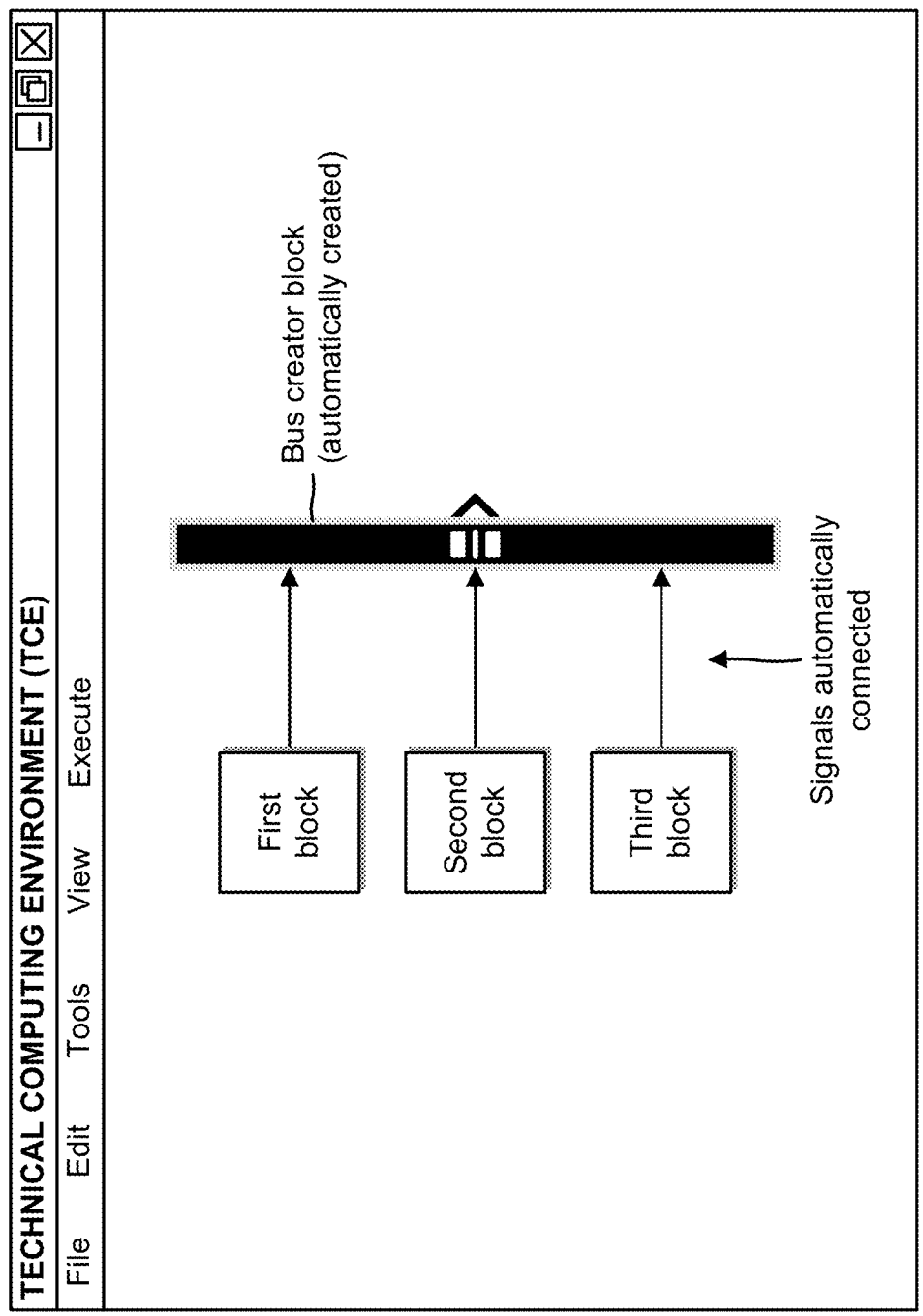

FIGS. 1A and 1B are diagrams of an overview of an example implementation 100 described herein. Example implementation 100 may be performed by a device, such as a computer, that includes a technical computing environment (TCE). The TCE may include any hardware-based component or a combination of hardware and software-based components that provides a computing environment that allows tasks to be performed related to disciplines, such as, but not limited to, mathematics, science, engineering, medicine, and business.

With reference to FIG. 1A, the device (e.g., via the TCE) may receive a model or may create the model based on a system (e.g., an information system, a technical system, a physical system, or the like). The model may include multiple blocks and multiple signals associated with the blocks. For example, the model may include a first block that generates a first signal, a second block that generates a second signal, and a third block that generates a third signal. As further shown in FIG. 1A, the signals generated by the blocks may be selected (e.g., via a selection mechanism, such as a mouse, a cursor, or the like) by enclosing the blocks within a selection box. When the blocks are enclosed within the selection box, a menu (e.g., a toolkit menu) may be displayed and may include various tools for manipulating the selected signals. Before displaying the toolkit menu, the device may analyze the selected signals to determine if there are signals that can be grouped into a semantically viable aggregation or collection. For example, the device may determine that there are at least two unconnected signals that are compatible (e.g., compatible dimensions, compatible data types, compatible sample times, compatible complexities (whether values have an imaginary part), compatible partial signal names (e.g., prefix, postfix, etc.), compatible signal sources or destinations, compatible instrumentation status (e.g., test pointed), compatible communication protocols (e.g., send/receive, publish/subscribe/broadcast/multicast, etc.), or the like). If the device determines that the selected signals, or a subset of the selected signals, can be grouped into a semantically viable aggregation (e.g., are unconnected and compatible), the toolkit menu may include one or more tools for grouping the selected signals, or a subset of the selected signals, into a semantically viable aggregation. For example, if the device determines that the selection includes signals that can be grouped into a bus, the toolkit menu may include a create bus tool for automatically creating a bus made up of the selected signals, or a subset of the selected signals. As further shown in FIG. 1A, the create bus tool may be selected (e.g., via the selection mechanism).

When the create bus tool is selected, the device may determine an orientation of the selected signals, and may determine a total number of the selected signals. For example, the device may determine that the orientation of the selected signals is left-to-right, and that the total number of the selected signals is three (e.g., the first signal, the second signal, and the third signal).

As shown in FIG. 1B, the device (e.g., via the TCE) may automatically create a bus creator block with a particular number of inputs, a particular size, a particular position, and a particular orientation based on the selected signals, the determined orientation of the selected signals, and/or the total number of the selected signals. For example, the particular number of inputs of the bus creator block may be large enough to receive the selected signals, the particular size of the bus creator block may be large enough to ease any user interaction that may occur at a later time, the particular position may be to the right of the selected signals (e.g., since the orientation of the selected signals is left-to-right), and the particular orientation may be left-to-right (e.g., since the orientation of the selected signals is left-to-right). As further shown in FIG. 1B, the device (e.g., via the TCE) may automatically connect the selected signals to the bus creator block in a particular order (e.g., a top-down order of the first signal, the second signal, and the third signal; a bottom-up order of the third signal, the second signal, and the first signal; or a random order).

Systems and/or methods, described herein, may automatically create a new block to group signals of a model into a semantically viable aggregation, and may automatically group signals of a model into a semantically viable aggregation. The systems and/or methods may reduce time, increase productivity, improve the user experience, and reduce computing resources associated with grouping multiple signals into a semantically viable aggregation. As discussed above, an implementation may automatically create a new bus creator block, and may automatically group signals of a model in a bus. In some implementations, the bus creator block may be replaced with a message block to create a message from multiple signals and a function-call signal, an adder block to mathematically add signals (e.g., values) together, an external container (e.g., a configuration file, a definition file, or the like) to group semantically compatible variables together, or the like.

FIG. 2 is a diagram of an example environment 200 in which systems and/or methods, described herein, may be implemented. As shown in FIG. 2, environment 200 may include a client device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

Client device 210 may include a device capable of receiving, generating, storing, processing, executing, and/or providing information, such as information associated with a model. For example, client device 210 may include a computing device, such as a desktop computer, a laptop computer, a tablet computer, a handheld computer, a server, a mobile phone (e.g., a smart phone, a radiotelephone, or the like), or a similar device. In some implementations, client device 210 may receive information from and/or provide information to server device 230.

Client device 210 may host TCE 220. Functions described herein as being performed by TCE 220 may be performed by client device 210 and execution of TCE 220 by client device 210. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dassault Systemes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from IBM; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

For example, TCE 220 may provide mathematical functions and/or graphical tools (e.g., for creating plots, surfaces, images, volumetric representations, or the like). In some implementations, TCE 220 may provide these functions and/or tools using toolboxes (e.g., toolboxes for signal processing, image processing, data plotting, parallel processing, or the like). In some implementations, TCE 220 may provide these functions as block sets or in another way, such as via a library, a local or remote database (e.g., a database operating in a computing cloud), remote procedure calls ("RPCs"), an application programming interface ("API"), or the like.

TCE 220 may include a modeling system that may be used in the creation of a functional model and that may enable generation of executable code based on the model. For example, TCE 220 may include a graphical modeling tool or application that provides a user interface for a numerical computing environment. Additionally, or alternatively, TCE 220 may include a graphical modeling tool and/or application that provides a user interface for modeling and simulating (e.g., by executing a model) a dynamic system (e.g., based on differential equations, difference equations, discrete events, discrete states, or the like). Execution of a model to simulate a system may also be referred to as simulating a model. The model may further include static relations (e.g., algebraic relations, stochastic relations, inequalities, or the like). In some implementations, the model may include different types, such as data flows, differential equations, difference equations, time-based block diagrams, state transition diagrams, entity flow diagrams, signal flow diagrams, discrete event systems, object diagrams, physical modeling diagrams, or the like.

Server device 230 may include one or more devices capable of receiving, generating, storing, processing, and/or providing information, such as information associated with a model. For example, server device 230 may include a computing device, such as a server, a desktop computer, a laptop computer, a tablet computer, or a similar device. In some implementations, server device 230 may host TCE 220. In some implementations, client device 210 may be used to access one or more TCEs 220 running on one or more server devices 230. For example, multiple server devices 230 may be used to execute code (e.g., serially or in parallel), and may provide respective results of executing the code to client device 210.

In some implementations, client device 210 and server device 230 may be owned by different entities. For example, an end user may own client device 210, and a third party may own server device 230. In some implementations, server device 230 may include a device operating in a cloud computing environment. In this way, front-end applications (e.g., a user interface) may be separated from back-end applications (e.g., code execution). Additionally, or alternatively, server device 230 may perform one, more, or all operations described elsewhere herein as being performed by client device 210.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
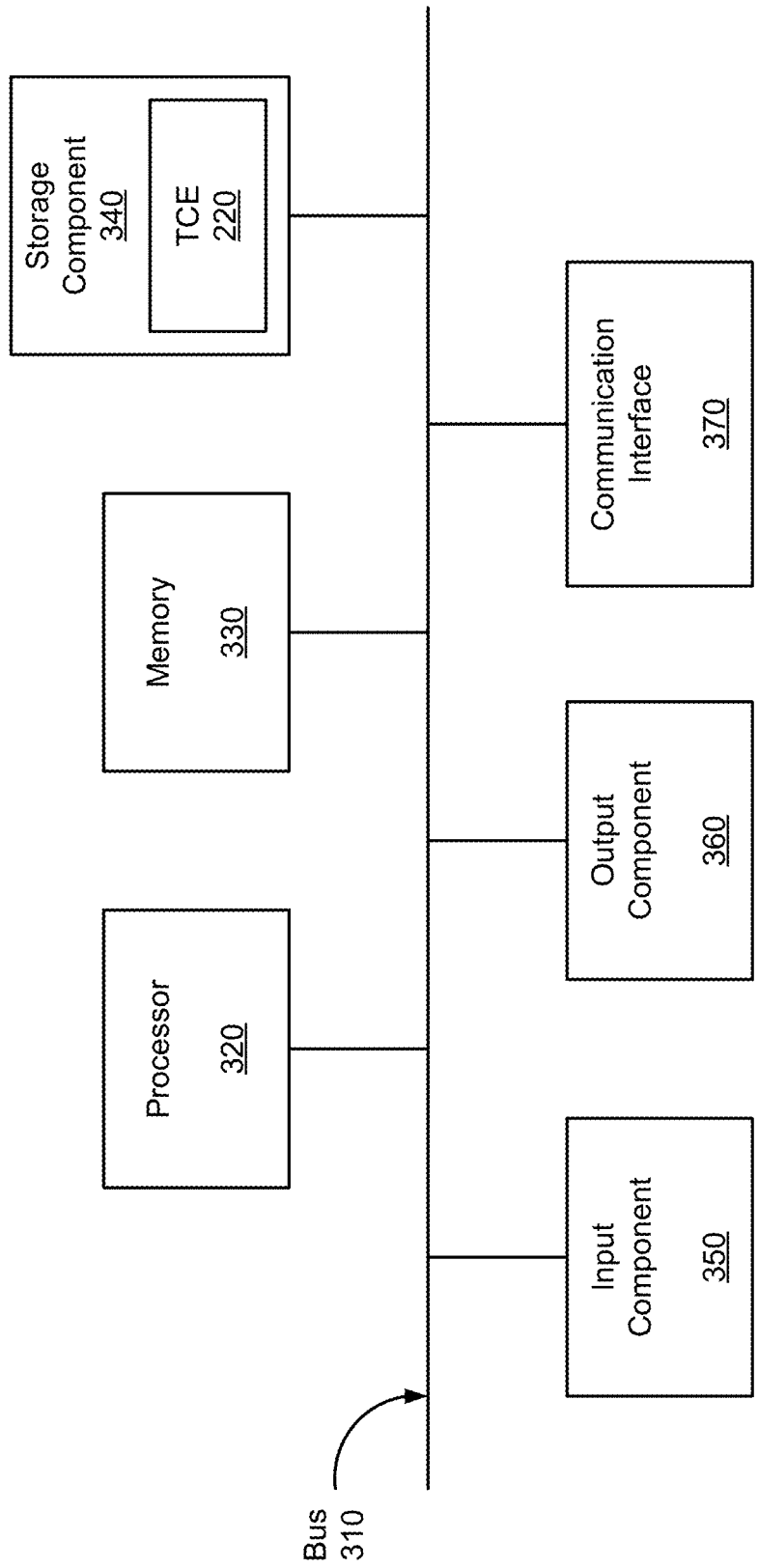
FIG. 3 is a diagram of example components of one or more devices of FIG. 2.

FIG. 3 is a diagram of example components of a device 300. Device 300 may correspond to client device 210 and/or server device 230. In some implementations, client device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 is implemented in hardware, firmware, or a combination of hardware and software. Processor 320 may include a processor (e.g., a central processing unit (CPU), a graphics processing unit (GPU), an accelerated processing unit (APU), or the like), a microprocessor, and/or any processing component (e.g., a field-programmable gate array (FPGA), an application-specific integrated circuit (ASIC), or the like) that interprets and/or executes instructions, and/or that is designed to implement one or more computing tasks. In some implementations, processor 320 may include multiple processor cores for parallel computing. Memory 330 may include a random access memory (RAM), a read only memory (ROM), and/or another type of dynamic or static storage device (e.g., a flash memory, a magnetic memory, an optical memory, or the like) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, or the like), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, or the like). Additionally, or alternatively, input component 350 may include a sensor for sensing information (e.g., a global positioning system (GPS) component, an accelerometer, a gyroscope, an actuator, or the like). Output component 360 may include a component that provides output information from device 300 (e.g., a display, a speaker, one or more light-emitting diodes (LEDs), or the like).

Communication interface 370 may include a transceiver-like component (e.g., a transceiver, a separate receiver and transmitter, or the like) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIGS. 4A-4F are diagrams of an example implementation 400 for automatically grouping signals of a model via buses. The operations described in connection with FIGS. 4A-4F are described as being performed by client device 210. In some implementations, the operations described in connection with FIGS. 4A-4F may be performed by another device or a group of devices separate from or including client device 210, such as server device 230.

Figure 4A:
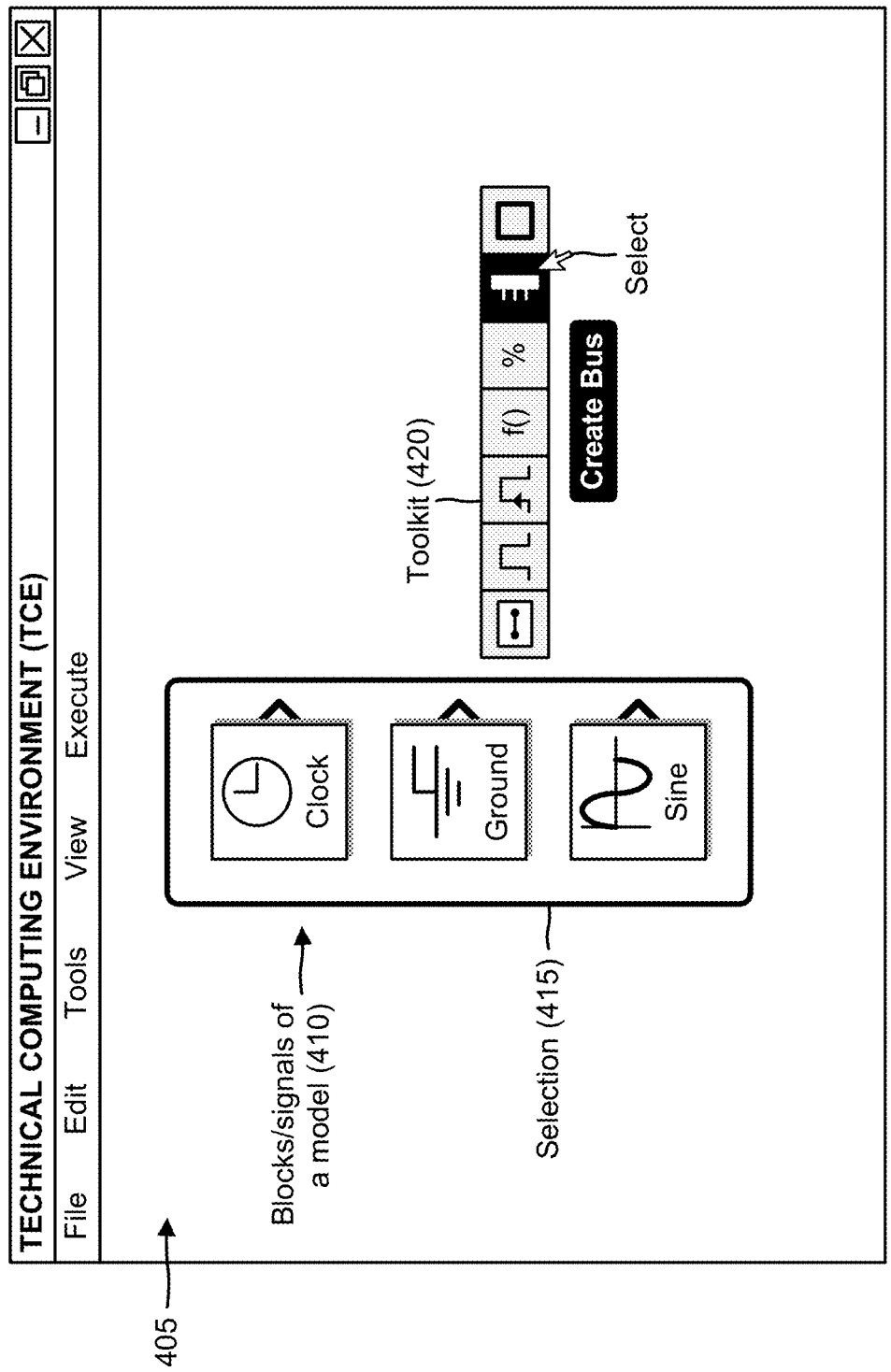

Assume that client device 210 receives a model from a storage device (e.g., memory 330 and/or storage component 340, FIG. 3). In some implementations, the model may be stored in a data structure associated with client device 210, and client device 210 may receive the model by accessing the data structure. Further, assume that client device 210 utilizes TCE 220 to display the model in a user interface 405, as shown in FIG. 4A. In example implementation 400, assume that the model includes one or more blocks and/or signals 410 (referred to hereafter as signals 410), such as a clock block that generates a clock signal, a ground block that generates a ground signal, and a sine wave block that generates a sine wave signal.

As further shown in FIG. 4A, signals 410 may be selected (e.g., via a selection mechanism, such as a mouse, a cursor, or the like) by enclosing signals 410 within a selection box 415. When signals 410 are enclosed within selection box 415, a toolkit menu 420 may be displayed and may include various tools for manipulating signals 410. Before displaying the toolkit menu, client device 210 (e.g., via TCE 220) may analyze signals 410 to determine that there are signals that can be grouped into a semantically viable aggregation. For example, client device 210 may determine whether there are at least two unconnected signals (e.g., of signals 410) that are compatible (e.g., compatible dimensions, compatible data types, or the like). If client device 210 determines that signals 410, or a subset of signals 410, can be grouped into a semantically viable aggregation (e.g., are unconnected and compatible), toolkit menu 420 may include one or more tools for grouping signals 410, or a subset of signals 410, into a semantically viable aggregation. For example, if client device 210 (e.g. via TCE 220) determines that the selection includes signals that can be grouped into a bus, toolkit menu 420 may include a create bus tool for automatically creating a bus for signals 410, or a subset of signals 410. As further shown in FIG. 4A, the create bus tool may be selected (e.g., via the selection mechanism) from toolkit menu 420.

When the create bus tool is selected, client device 210 may determine an orientation of signals 410, and may determine a total number of signals 410. For example, client device 210 may determine that signals 410 are oriented to output signals from left-to-right, and that the total number of signals 410 is three (e.g., the clock signal, the ground signal, and the sine wave signal).

As shown in a user interface 425 of FIG. 4B, client device 210 (e.g., via TCE 220) may automatically create a bus creator block 430 with a particular number of inputs, a particular size, a particular position, and a particular orientation based on signals 410, the determined orientation of signals 410, and/or the total number of signals 410. For example, the particular number of inputs of bus creator block 430 may be large enough to receive signals 410, the particular size of the bus creator block may be large enough to ease any user interaction that may occur at a later time, the particular position may be to the right of signals 410 (e.g., since signals 410 are output from left to right), and the particular orientation 435 may be left-to-right (e.g., since the orientation of the signals 410 is left-to-right). As further shown in FIG. 4B, client device 210 (e.g., via TCE 220) may automatically connect signals 410 to bus creator block 430 in a particular order (e.g., a top-down order, a bottom-up order, a random order, or the like), as indicated by reference number 440.

Figure 4C:
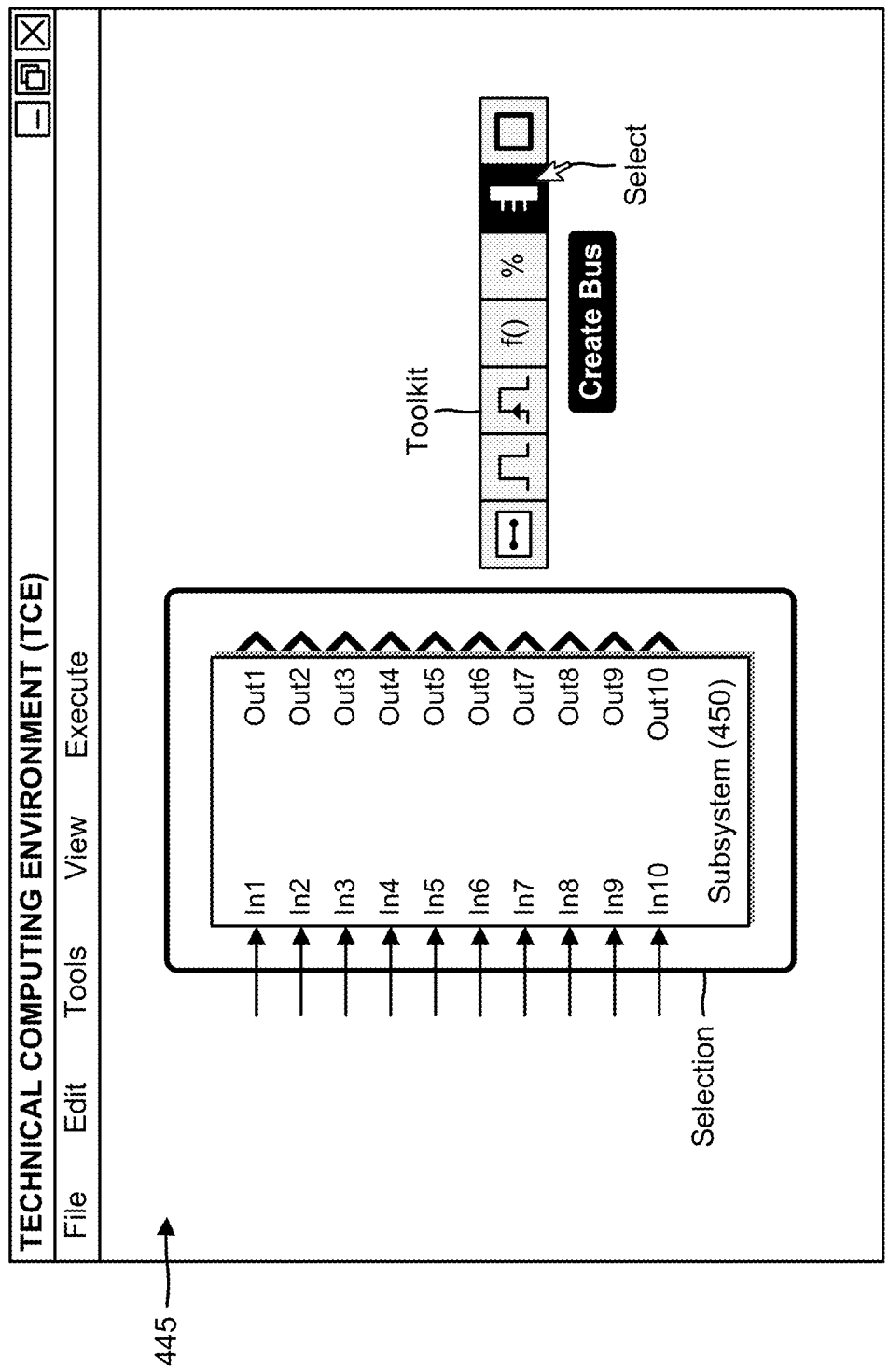

Now assume that client device 210 receives a second model from a storage device (e.g., memory 330 and/or storage component 340, FIG. 3). In some implementations, the second model may be stored in a data structure associated with client device 210, and client device 210 may receive the second model by accessing the data structure. Further, assume that client device 210 utilizes TCE 220 to display the second model in a user interface 445, as shown in FIG. 4C. In example implementation 400, assume that the second model includes a subsystem block 450 with ten (10) input (In) signals and ten (10) output (Out) signals.

As further shown in FIG. 4C, subsystem block 450 may be selected (e.g., via a selection mechanism, such as a mouse, a cursor, or the like) by enclosing subsystem block 450 within a selection box, by hovering over subsystem block 450, by selecting subsystem block 450, or the like. When subsystem block 450 is selected, a toolkit menu may be displayed and may include various tools for manipulating the input and/or output signals of subsystem block 450. Before displaying the toolkit, client device 210 (e.g., via TCE 220) may analyze the output signals of subsystem block 450 to determine that there are signals that can be grouped into a semantically viable aggregation (e.g., that there are at least two unconnected signals that are compatible). If client device 210 determines that the output signals of subsystem block 450, or a subset of the output signals of subsystem block 450, can be grouped into a semantically viable aggregation (e.g., are unconnected and compatible), the toolkit menu may include one or more tools for grouping the output signals of subsystem block 450, or a subset of the output signals of subsystem block 450, into a semantically viable aggregation. For example, if client device 210 (e.g. via TCE 220) determines that the output signals of subsystem block 450, or a subset of the output signals of subsystem block 450, can be grouped into a bus, the toolkit menu may include a create bus tool for automatically creating a bus for the output signals of subsystem block 450, or a subset of the output signals of subsystem block 450. As further shown in FIG. 4C, the create bus tool may be selected (e.g., via the selection mechanism) from the toolkit menu.

When the create bus tool is selected, client device 210 may determine an orientation of the output signals of subsystem block 450, and may determine a total number of the output signals of subsystem block 450. For example, client device 210 may determine that the output signals of subsystem block 450 are oriented to output from subsystem block 450 from left to right, and that the total number of the output signals of subsystem block 450 is ten.

As shown in a user interface 455 of FIG. 4D, client device 210 (e.g., via TCE 220) may automatically create a bus creator block 460 with a particular number of inputs, with a particular size, a particular position, and a particular orientation based on the output signals of subsystem block 450, the determined orientation of the output signals of subsystem block 450, and/or the total number of the output signals of subsystem block 450. For example, the particular number of inputs of bus creator block 460 may be large enough to receive the selected signals, the particular size of bus creator block 460 may be large enough to ease any user interaction that may occur at a later time, the particular position may be to the right of subsystem block 450 (e.g., since the output signals of subsystem block 450 are output from left to right), and the particular orientation may be left-to-right (e.g., since the orientation of the output signals of subsystem block 450 are left-to-right). Client device 210 (e.g., via TCE 220) may automatically connect the output signals of subsystem block 450 to bus creator block 460 in a particular order (e.g., a top-down order, a bottom-up order, a random order, or the like).

Figure 4E:
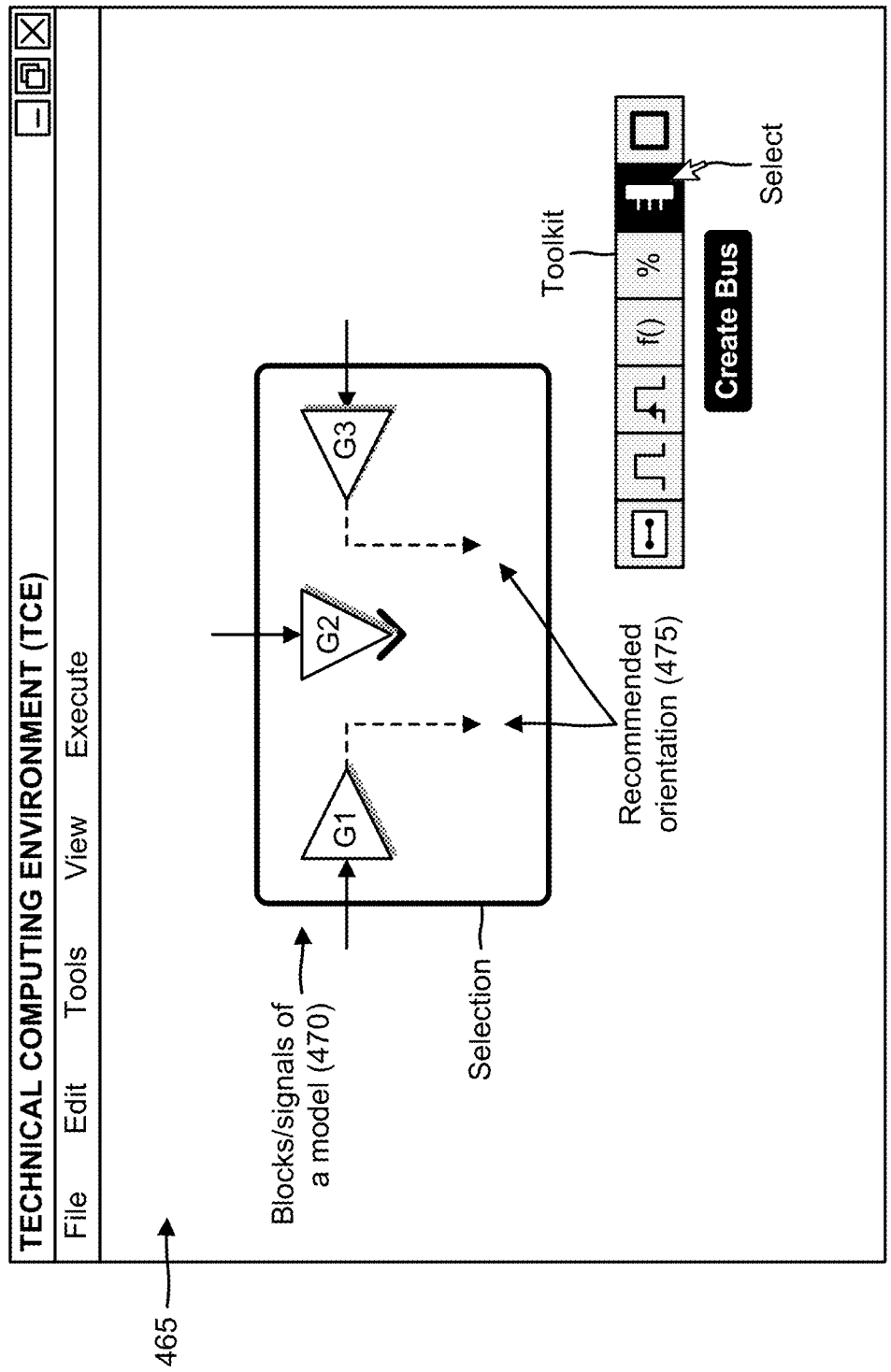

Now assume that client device 210 receives a third model from a storage device (e.g., memory 330 and/or storage component 340, FIG. 3). In some implementations, the third model may be stored in a data structure associated with client device 210, and client device 210 may receive the third model by accessing the data structure. Further, assume that client device 210 utilizes TCE 220 to display the third model in a user interface 465, as shown in FIG. 4E. In example implementation 400, assume that the third model includes one or more blocks and/or signals 470 (referred to hereafter as signals 470), such as a first gain block (G1) that generates a first signal, a second gain block (G2) that generates a second signal, and a third gain block (G3) that generates a third signal.

As further shown in FIG. 4E, signals 470 may be selected (e.g., via a selection mechanism, such as a mouse, a cursor, or the like) by enclosing signals 470 within a selection box. When signals 470 are enclosed within the selection box, a toolkit menu may be displayed and may include various tools for manipulating signals 470. Before displaying the toolkit menu, client device 210 (e.g., via TCE 220) may analyze signals 470 to determine that there are signals that can be grouped into a semantically viable aggregation (e.g., are at least two unconnected signals, of signals 470, that are compatible). If client device 210 determines that signals 470, or a subset of signals 470, can be grouped into a semantically viable aggregation (e.g., are unconnected and compatible), the toolkit menu may include one or more tools for grouping signals 470, or a subset of signals 470, into a semantically viable aggregation. For example, if client device 210 (e.g. via TCE 220) determines that signals 470, or a subset of signals 470, can be grouped into a bus, the toolkit menu may include a create bus tool for automatically creating a bus for signals 470, or a subset of signals 470.

As further shown in FIG. 4E, the create bus tool may be selected (e.g., via the selection mechanism) from the toolkit menu. When signals 470 are enclosed within the selection box, some implementations may further process the selection to obtain clues or recommendations regarding the orientation of the bus creator block, or another block to create the aggregation, to be created. For example, client device 210 may determine that even though the orientations of the first and third gain blocks are left-to-right and right-to-left, respectively, the first and the third signals coming out of the first and the third gain blocks are provided in a downward direction and the orientation of the bus creator block that will be automatically created should be top-to-bottom. When the orientations of the selected signals differ from each other, some implementations may consider the most popular orientation, or the orientation may be based on modeling style guidelines. If there is still a tie, some implementations may use an orientation based on an order of preference and/or the orientations of the selected signals, e.g., left-to-right if at least one selected signal is oriented left-to-right, right-to-left if at least one selected signal is oriented right-to-left, top-to-bottom if at least one selected signal is oriented top-to-bottom, and bottom-to-top if at least one selected signal is oriented bottom-to-top.

When the create bus tool is selected, client device 210 may determine an orientation of signals 470, and may determine a total number of signals 470. For example, client device 210 may determine that signals 470 are oriented to output signals top-to-bottom, and that the total number of signals 470 is three (e.g., the first gain signal, the second gain signal, and the third gain signal).

As shown in a user interface 480 of FIG. 4F, client device 210 (e.g., via TCE 220) may automatically create a bus creator block 485 with a particular number of inputs, a particular size, a particular position, and a particular orientation based on signals 470, the determined orientation of signals 470, and/or the total number of signals 470. For example, the particular number of inputs of the bus creator block 485 may be large enough to receive the selected signals, the particular size of the bus creator block may be large enough to ease any user interaction that may occur at a later time, the particular position may be below signals 470 (e.g., since signals 470 are output in a downward direction), and the particular orientation may be top-to-bottom (e.g., since the orientation of signals 470 is top-to-bottom). As further shown in FIG. 4F, client device 210 (e.g., via TCE 220) may automatically connect signals 470 to bus creator block 485 in a particular order (e.g., a left to right order, a right to left order, a random order, or the like).

As indicated above, FIGS. 4A-4F are provided merely as an example. Other examples are possible and may differ from what was described with regard to FIGS. 4A-4F.

FIGS. 5A-5D are diagrams of an example implementation 500 for automatically grouping signals of a model via bus ports and bus creator blocks. The operations described in connection with FIGS. 5A-5D are described as being performed by client device 210. In some implementations, the operations described in connection with FIGS. 5A-5D may be performed by another device or a group of devices separate from or including client device 210, such as server device 230.

Figure 5A:
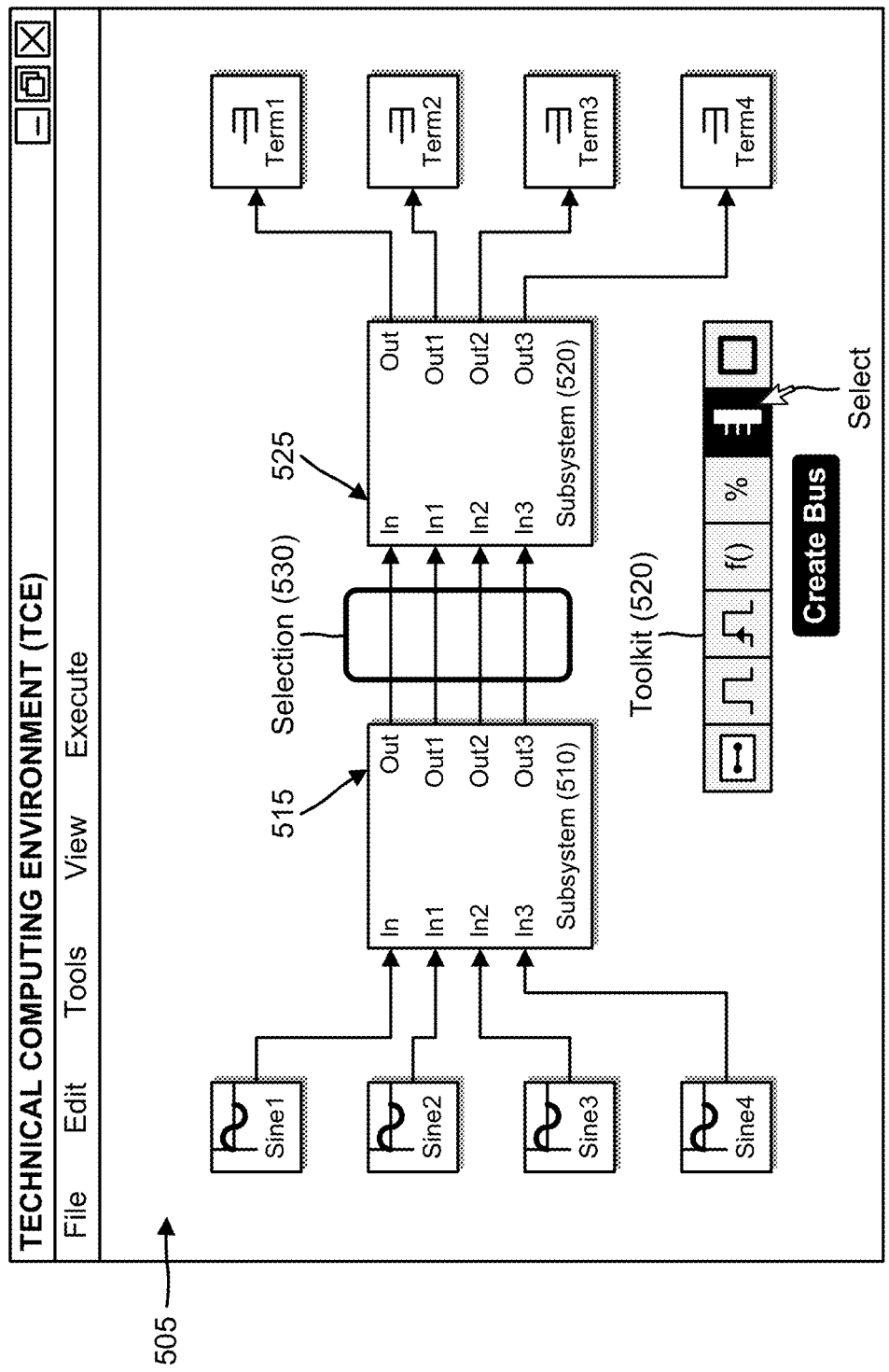
FIGS. 5A-5D are diagrams of an example implementation for automatically grouping signals of a model via composite ports and buses.

Assume that client device 210 receives a model from a storage device (e.g., memory 330 and/or storage component 340, FIG. 3). In some implementations, the model may be stored in a data structure associated with client device 210, and client device 210 may receive the model by accessing the data structure. Further, assume that client device 210 utilizes TCE 220 to display the model in a user interface 505, as shown in FIG. 5A. In example implementation 500, assume that the model includes one or more blocks and/or signals, such as a first subsystem block 510 and a second subsystem block 520. First subsystem block 510 may include four sine wave input signals (In) and four output signals (Out) 515. Second subsystem block 520 may include four input signals (In) 525 (e.g., output signals 515 from first subsystem block 510) and four output signals (Out).

As further shown in FIG. 5A, output signals 515 and input signals 525 may be selected (e.g., via a selection mechanism, such as a mouse, a cursor, or the like) by enclosing output signals 515/input signals 525 within a selection box 530. When output signals 515/input signals 525 are enclosed within selection box 530, a toolkit menu 520 may be displayed and may include various tools for manipulating output signals 515/input signals 525. Before displaying toolkit menu 520, client device 210 (e.g., via TCE 220) may analyze output signals 515/input signals 525 to determine if there are signals that can be grouped into a semantically viable aggregation (e.g., are at least two signals, of output signals 515/input signals 525, that are compatible). If client device 210 determines that output signals 515/input signals 525, or a subset of output signals 515/input signals 525, can be grouped into a semantically viable aggregation (e.g., are compatible), toolkit menu 520 may include one or more tools for grouping output signals 515/input signals 525, or a subset of output signals 515/input signals 525, into a semantically viable aggregation. For example, if client device 210

(e.g. via TCE 220) determines that output signals 515/input signals 525, or a subset of output signals 515/input signals 525, can be grouped into a bus, toolkit menu 520 may include a create bus tool for automatically creating a bus for output signals 515/input signals 525, or a subset of output signals 515/input signals 525. As further shown in FIG. 5A, the create bus tool may be selected (e.g., via the selection mechanism) from toolkit menu 520.

When the create bus tool is selected, client device 210 may determine an orientation of output signals 515/input signals 525, and may determine a total number of output signals 515/input signals 525. For example, client device 210 may determine that output signals 515/input signals 525 are oriented to output from left to right, and that the total number of output signals 515/input signals 525 is four.

Figure 5B:
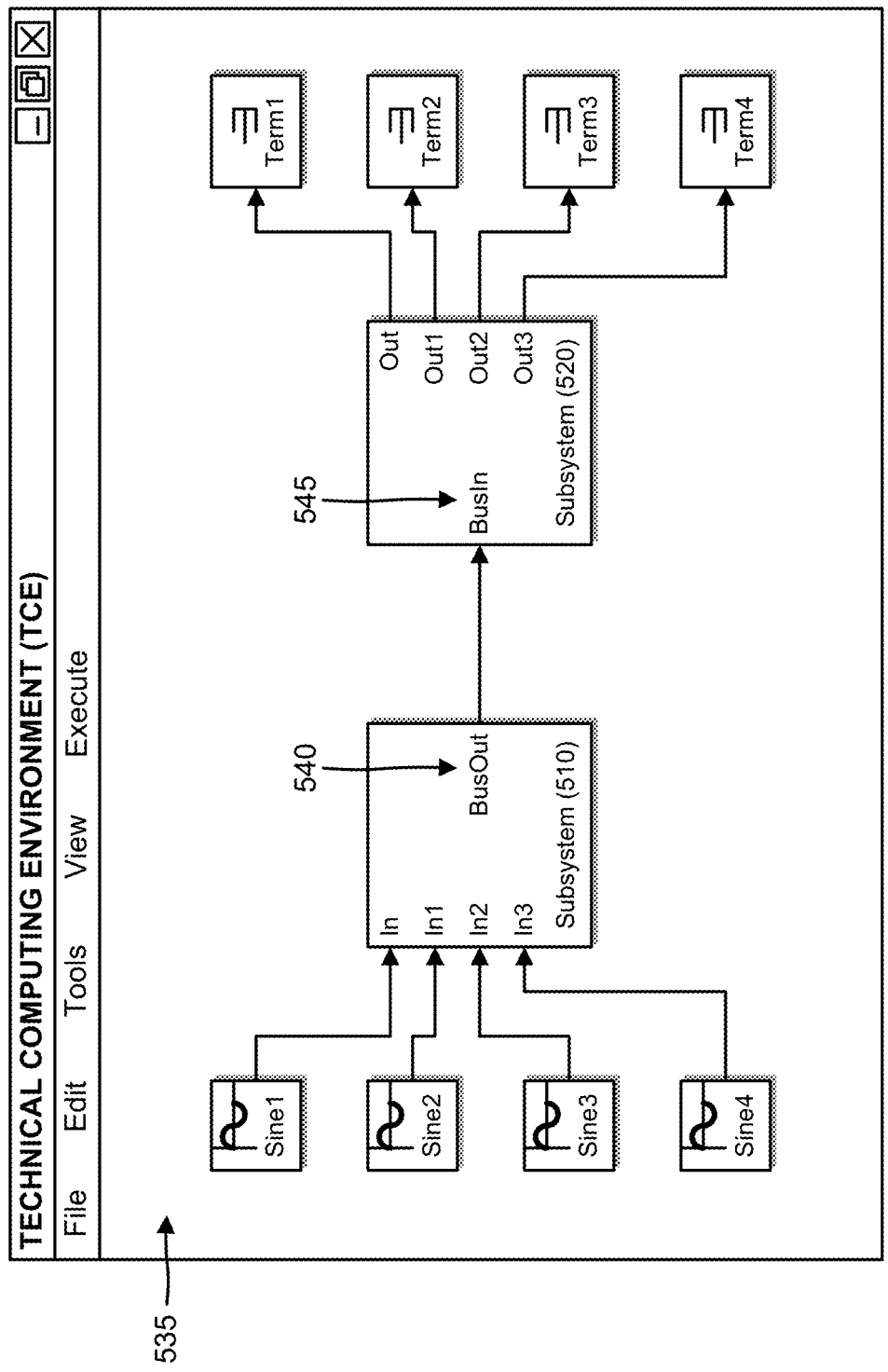

As shown in a user interface 535 of FIG. 5B, client device 210 (e.g., via TCE 220) may automatically create a bus output port 540 in first subsystem block 510 and a bus input port 545 in second subsystem block 520 based on output signals 515/input signals 525, the determined orientation of output signals 515/input signals 525, and/or the total number of output signals 515/input signals 525. For example, bus output port 540 may combine output signals 515 into a single output signal, which may be a bus that contains output signals 515, and may provide the single output signal to second subsystem block 520. Bus input port 545 may receive the single signal from bus output port 540, and may divide the single input signal into four signals, which may correspond to input signals 525, to be used in second subsystem block 520. In some implementations, a bus port (e.g., a bus input port and/or a bus output port) may reduce clutter at component interfaces, may improve the readability of the model due to the reduced clutter, and may include an enhanced input/output block that can access elements of a bus connected to a port of a component.

In some implementations, a created bus port may be undone, and a single signal (e.g., an input signal and/or an output signal) associated with the created bus may be expanded into multiple signals. For example, bus output port 540 may by undone, and the single output signal associated with bus output port may be expanded into output signals 515.

In some implementations, when a set of ports are collapsed into a bus port, the set of ports may be replaced with a bus port that accesses elements of interest in a subsystem (e.g., signals that are initially selected). This may result in a single bus port at an interface, but multiple blocks that access elements of the created bus port may be provided inside the subsystem. In some implementations, if the set of ports that are collapsed into the bus port are input ports, corresponding inport blocks may be replaced inside the subsystem with a single inport block and a bus selector block. The new inport block may then be connected to the bus selector block. In the bus selector block, signals of interest may be selected (e.g., the signals that are initially selected), and the signals of interest may be connected to blocks that used the signals before the creation of the bus port. In some implementations, if the set of ports that are collapsed into bus port are output ports, corresponding outport blocks may be replaced inside the subsystem with a single bus creator block and an outport block. The signals of interest (e.g., the signals that are initially selected) may be connected to the bus creator block. Then, an output of the bus creator block may be connected to the new outport block.

Figure 5C:
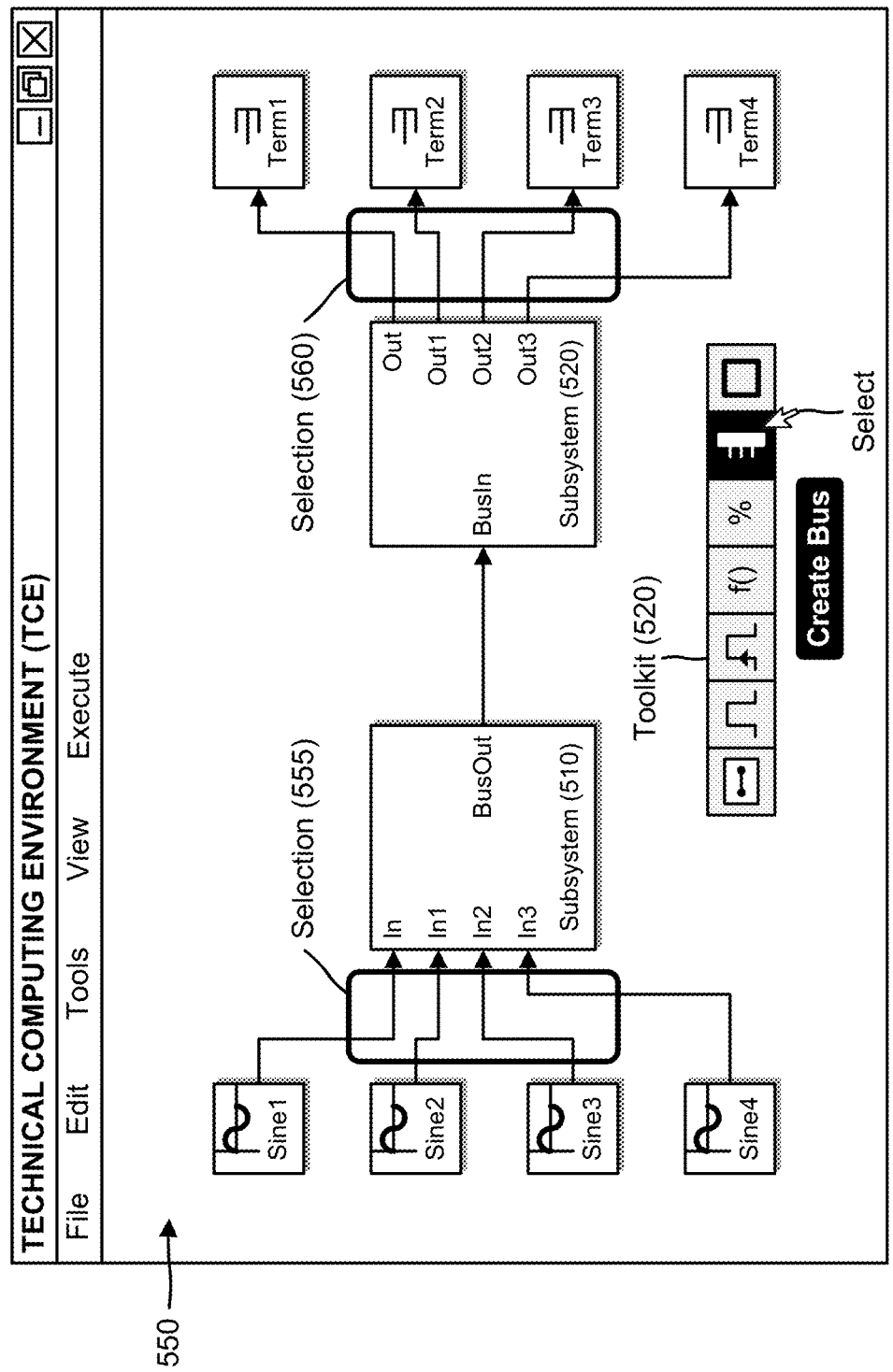

As shown in a user interface 550 of FIG. 5C, the four input signals of subsystem 510 may be selected (e.g., via a selection mechanism) by enclosing them within a selection box 555. When the input signals are enclosed within selection box 555, toolkit menu 520 may be displayed, and may include various tools for manipulating the input signals of subsystem 510. Before displaying toolkit menu 520, client device 210 (e.g., via TCE 220) may analyze the four input signals to determine if there are signals that can be grouped into a semantically viable aggregation (e.g., are at least two of the input signals that are compatible). If client device 210 determines that the input signals, or a subset of the input signals, can be grouped into a semantically viable aggregation (e.g., are compatible), toolkit menu 520 may include one or more tools for grouping the input signals, or a subset of the input signals, into a semantically viable aggregation. For example, if client device 210 (e.g. via TCE 220) determines that the input signals, or a subset of the input signals, can be grouped into a bus, toolkit menu 520 may include a create bus tool for automatically creating a bus for the input signals, or a subset of the input signals. As further shown in FIG. 5C, the create bus tool may be selected (e.g., via the selection mechanism) from toolkit menu 520.

When the create bus tool is selected, client device 210 may determine an orientation of the input signals, and may determine a total number of the input signals. For example, client device 210 may determine that the input signals are oriented to output signals from left to right, and that the total number of the input signals is four.

Figure 5D:
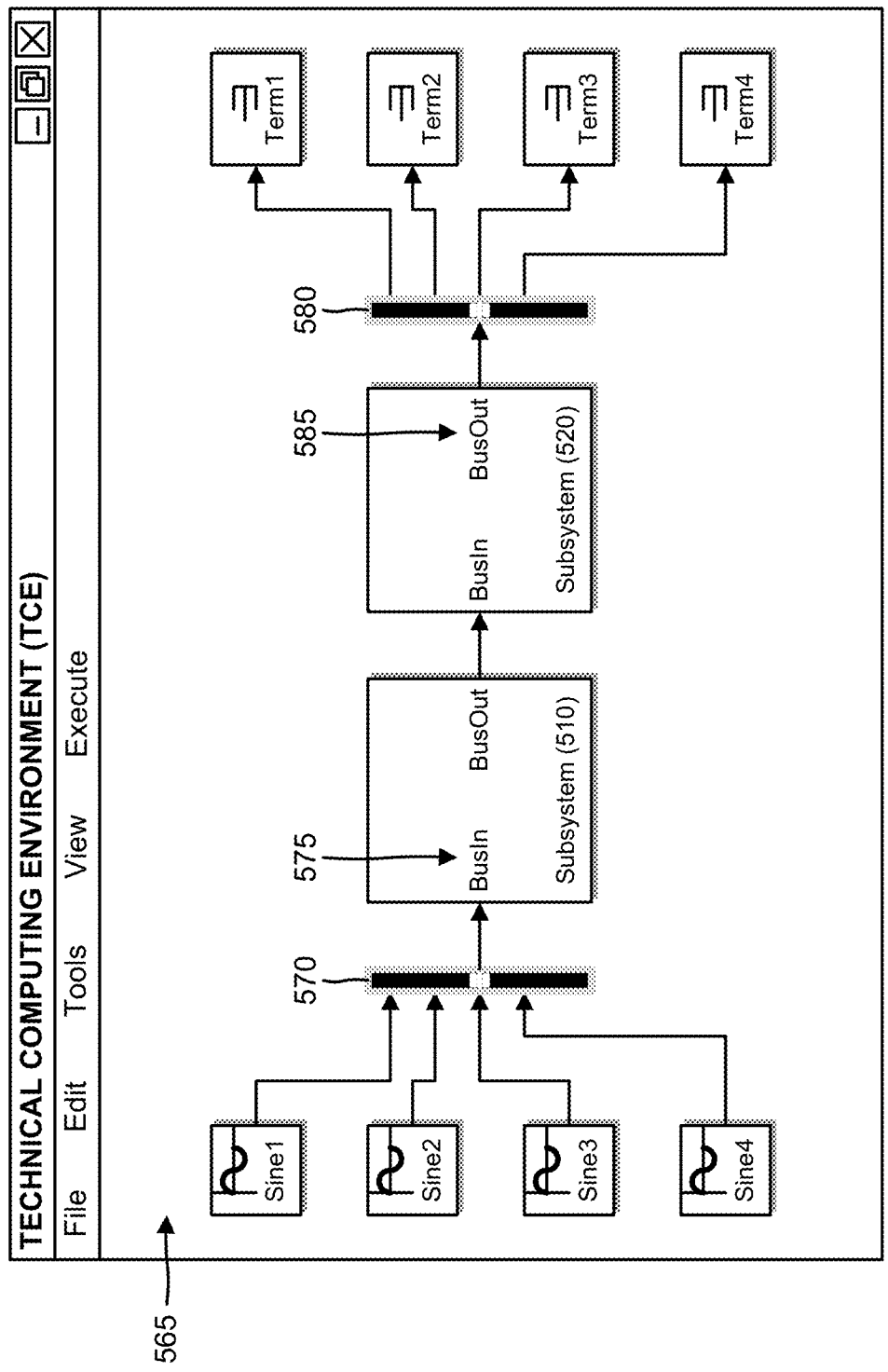

As shown in a user interface 565 of FIG. 5D, client device 210 (e.g., via TCE 220) may automatically create a bus creator block 570 with a particular number of inputs, a particular size, a particular position, and a particular orientation based on the selected signals, the determined orientation of the selected signals, and/or the total number of selected input signals. For example, the particular number of inputs of the bus creator block 570 may be large enough to receive the selected signals, the particular size of bus creator block 570 may be large enough to ease any user interaction that may occur at a later time, the particular position may be to the right of the sine wave input signals (e.g., since the input signals are output from left to right), and the particular orientation may be left-to-right (e.g., since the orientation of the input signals is left-to-right). As further shown in FIG. 5D, client device 210 (e.g., via TCE 220) may automatically connect the signals to bus creator block 570 in a particular order (e.g., a top-down order, a bottom-up order, a random order, or the like). Bus creator block 570 may group the selected signals in a bus signal, and may provide this single bus signal to first subsystem block 510. As further shown in FIG. 5D, client device 210 (e.g., via TCE 220) may automatically remove the four original input ports (In, In1, In2, and In3) and create a bus input port 575 in first subsystem block 510 in order to receive the single input signal from bus creator block 570. Client device 210 may automatically connect bus creator block 570 to bus input port 575.

As further shown in FIG. 5C, at a later time, the four output signals of subsystem 520 may be selected (e.g., via a selection mechanism) by enclosing them within a selection box 560. When the output signals are enclosed within selection box 560, toolkit menu 520 may be displayed, and may include various tools for manipulating the output signals of subsystem 520. Before displaying toolkit menu 520, client device 210 (e.g., via TCE 220) may analyze the four output signals to determine if there are signals that can be grouped into a semantically viable aggregation (e.g., are at least two of the input signals that are compatible). If client device 210 determines that the output signals, or a subset of the output signals, can be grouped into a semantically viable aggregation (e.g., are compatible), toolkit menu 520 may include one or more tools for grouping the output signals, or a subset of the output signals, into a semantically viable aggregation. For example, if client device 210 (e.g. via TCE 220) determines that the output signals, or a subset of the output signals, can be grouped into a bus, toolkit menu 520 may include a create bus tool for automatically creating a bus for the output signals, or a subset of the output signals. As further shown in FIG. 5C, the create bus tool may be selected (e.g., via the selection mechanism) from toolkit menu 520.

When the create bus tool is selected, client device 210 may determine an orientation of the output signals, and may determine a total number of the output signals. For example, client device 210 may determine that the output signals are oriented to output signals from left to right, and that the total number of the output signals is four.

As shown in FIG. 5D, client device 210 (e.g., via TCE 220) may automatically create a bus output port 585 in second subsystem block 520 to output a single bus signal that groups all the signals contained in selection 560. As further shown in FIG. 5D, client device 210 (e.g., via TCE 220) may automatically create a bus selector block 580 with a particular number of outputs, a particular size, a particular position, and a particular orientation based on the selected signals, the determined orientation of the selected signals, and/or the total number of selected signals. For example, the particular number of outputs of bus selector block 580 may be large enough to output all of the selected signals, the particular position may be to the right of subsystem 520 (e.g., since the selected signals are output from left to right), and the particular orientation may be left-to-right (e.g., since the selected signals are output left-to-right). As further shown in FIG. 5D, client device 210 (e.g., via TCE 220) may automatically connect the output of subsystem 520 to bus selector block 580 and the outputs of the bus selector block 580 to terminator blocks Term1, Term2, Term3, and Term4 in FIG. 5D in a particular order (e.g., a left to right order, a right to left order, a random order, or the like).

As indicated above, FIGS. 5A-5D are provided merely as an example. Other examples are possible and may differ from what was described with regard to FIGS. 5A-5D.

FIGS. 6A-6D are diagrams of an example implementation 600 for selecting signals from a main bus and automatically grouping the selected signals via a secondary bus. The operations described in connection with FIGS. 6A-6D are described as being performed by client device 210. In some implementations, the operations described in connection with FIGS. 6A-6D may be performed by another device or a group of devices separate from or including client device 210, such as server device 230.

Figure 6A:
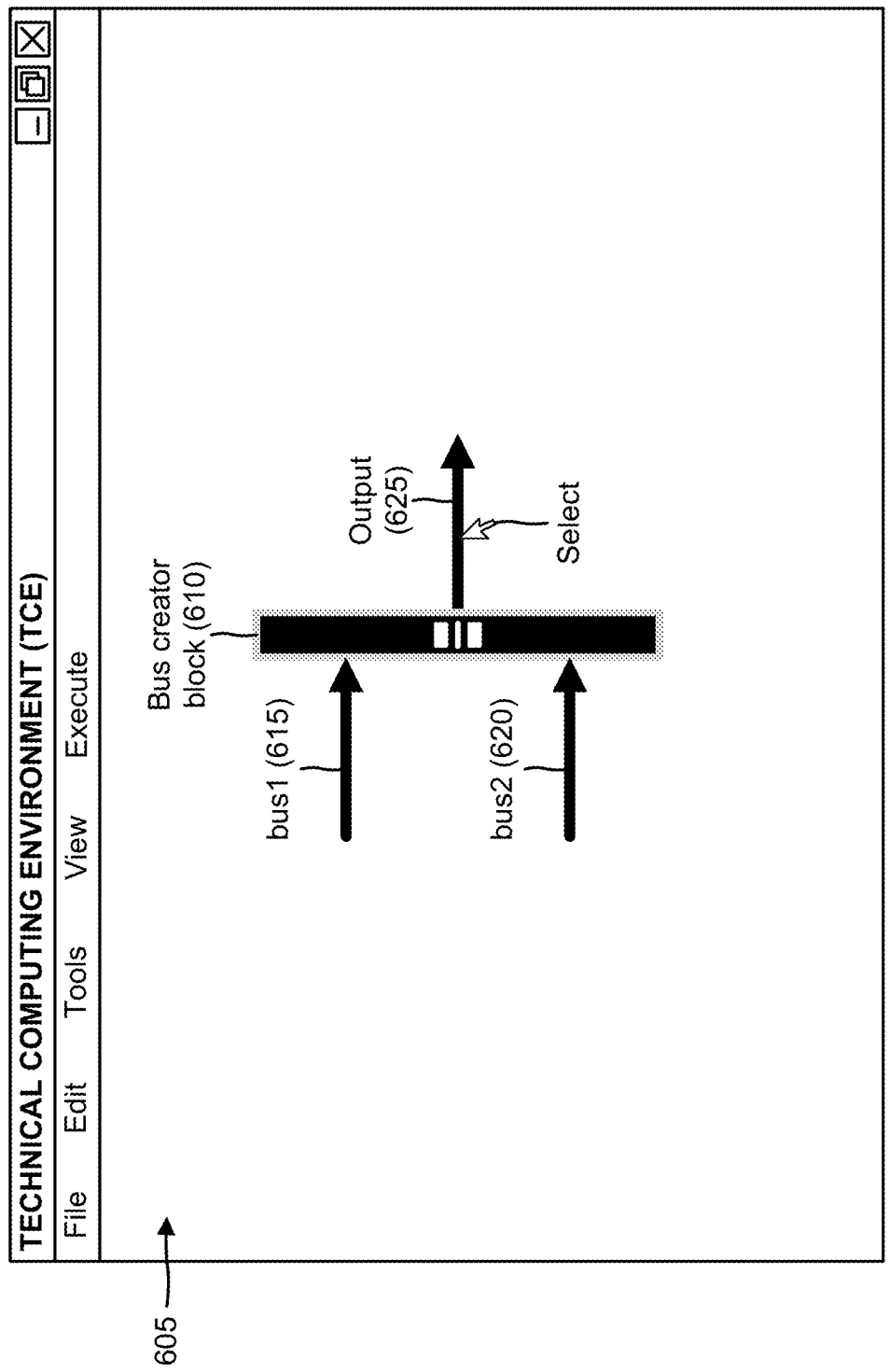

Assume that client device 210 receives a model from a storage device (e.g., memory 330 and/or storage component 340, FIG. 3). In some implementations, the model may be stored in a data structure associated with client device 210, and client device 210 may receive the model by accessing the data structure. Further, assume that client device 210 utilizes TCE 220 to display the model in a user interface 605, as shown in FIG. 6A. In example implementation 600, assume that the model includes a bus creator block 610 that receives a first input signal (bus1) 615 and a second input signal (bus2) 620, and combines first input signal 615 and second input signal 620 into an output signal 625. As further shown in FIG. 6A, output signal 625 may be selected (e.g., via a selection mechanism, such as a mouse, a cursor, or the like).

Figure 6B:
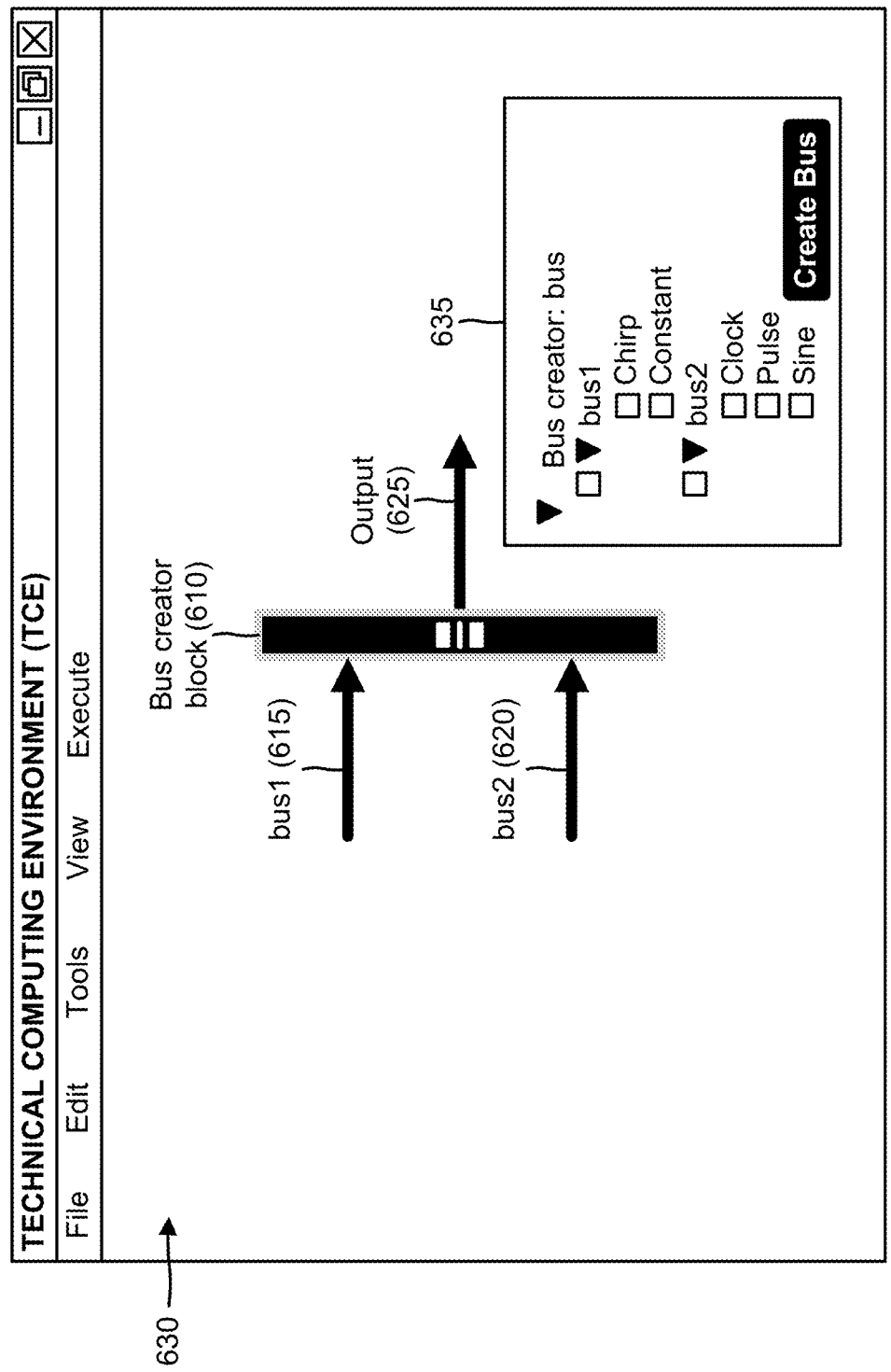

As shown in a user interface 630 of FIG. 6B, when output signal 625 is selected (e.g., via a selection mechanism, such as a mouse, a cursor, or the like), a dialog window 635 may be displayed and may include information associated with the bus generated by bus creator block 610, such as information associated with first input signal 615 and second input signal 620. For example, dialog window 635 may indicate that first input signal (bus1) 615 includes a chirp signal and a constant signal, and that second input signal (bus2) 620 includes a clock signal, a pulse signal, and a sine wave signal. In some implementations, dialog window 635 may include a separate dialog container (e.g., with OK and Cancel operations). In some implementations, dialog window 635 may be replaced with a graphical affordance that appears as an overlay on a model canvas (e.g., like a tooltip, a selection box, a selection dialog, a selection affordance, or the like). The graphical affordance may be a direct overlay on the model canvas that appears upon selection of a bus output signal (e.g., by selecting a bus line or a bus creator output port).

As shown in a user interface 640 of FIG. 6C, one or more of the chirp signal, the constant signal, the clock signal, the pulse signal, and the sine wave signal may be selected (e.g., via a selection mechanism) from dialog window 635. For example, the chirp signal associated with first input signal 615 may be selected, as indicated by reference number 645, and the clock signal associated with second input signal 620 may be selected, as indicated by reference number 650. After selecting the chirp signal and the clock signal, a create bus tool (e.g., a button, an icon, a link, or the like) may be selected (e.g., via the selection mechanism).

When the create bus tool is selected, client device 210 (e.g., via TCE 220) may analyze the selected signals to determine that there are signals that can be grouped into a semantically viable aggregation (e.g., are at least two of the selected signals, that are compatible). If client device 210 determines that the selected signals can be grouped into a semantically viable aggregation (e.g., are compatible), client device 210 may determine an orientation of the selected signals, and may determine a total number of the selected signals. For example, client device 210 may determine that the selected signals are oriented to output from left to right, and that the total number of the selected signals is two.

As shown in a user interface 655 of FIG. 6D, client device 210 (e.g., via TCE 220) may automatically create a bus selector block 660 with a particular number of inputs, a particular number of outputs, a particular size, a particular position, and a particular orientation based on the selected signals, the determined orientation of the selected signals, and/or the total number of the selected signals. For example, the particular size of bus selector block 660 may be large enough to receive the selected signals, the particular position may be to the right and below of the point where the selection is performed (e.g., since output signal 625 of bus creator block 610 is from left to right), and the particular orientation may be left-to-right. Some implementations may set the number of outputs of bus selector block 660 to one and may group the selected signals as a new bus. As further shown in FIG. 6D, some implementations may omit the creation of this secondary bus, may set the number of outputs of bus selector block 660 to the number of selected signals and bus selector block 660 may output the selected signals individually, e.g., the chirp signal, as indicated by reference number 665, and the clock signal, as indicated by reference number 670.

As indicated above, FIGS. 6A-6D are provided merely as an example. Other examples are possible and may differ from what was described with regard to FIGS. 6A-6D. For example, some implementations may utilize different selection mechanisms (e.g., a mouse, a cursor, hovering, a graphical prompt, a textual prompt, or the like) to display dialog window 635. Some implementations may work on and/or group the selected signals into other types of semantically viable aggregations (e.g., messages, arrays, matrices, or the like).

FIGS. 7A-7E are diagrams of an example implementation 700 for automatically grouping variables of textual code. The operations described in connection with FIGS. 7A-7E are described as being performed by client device 210. In some implementations, the operations described in connection with FIGS. 7A-7E may be performed by another device or a group of devices separate from or including client device 210, such as server device 230.

Figure 7A:
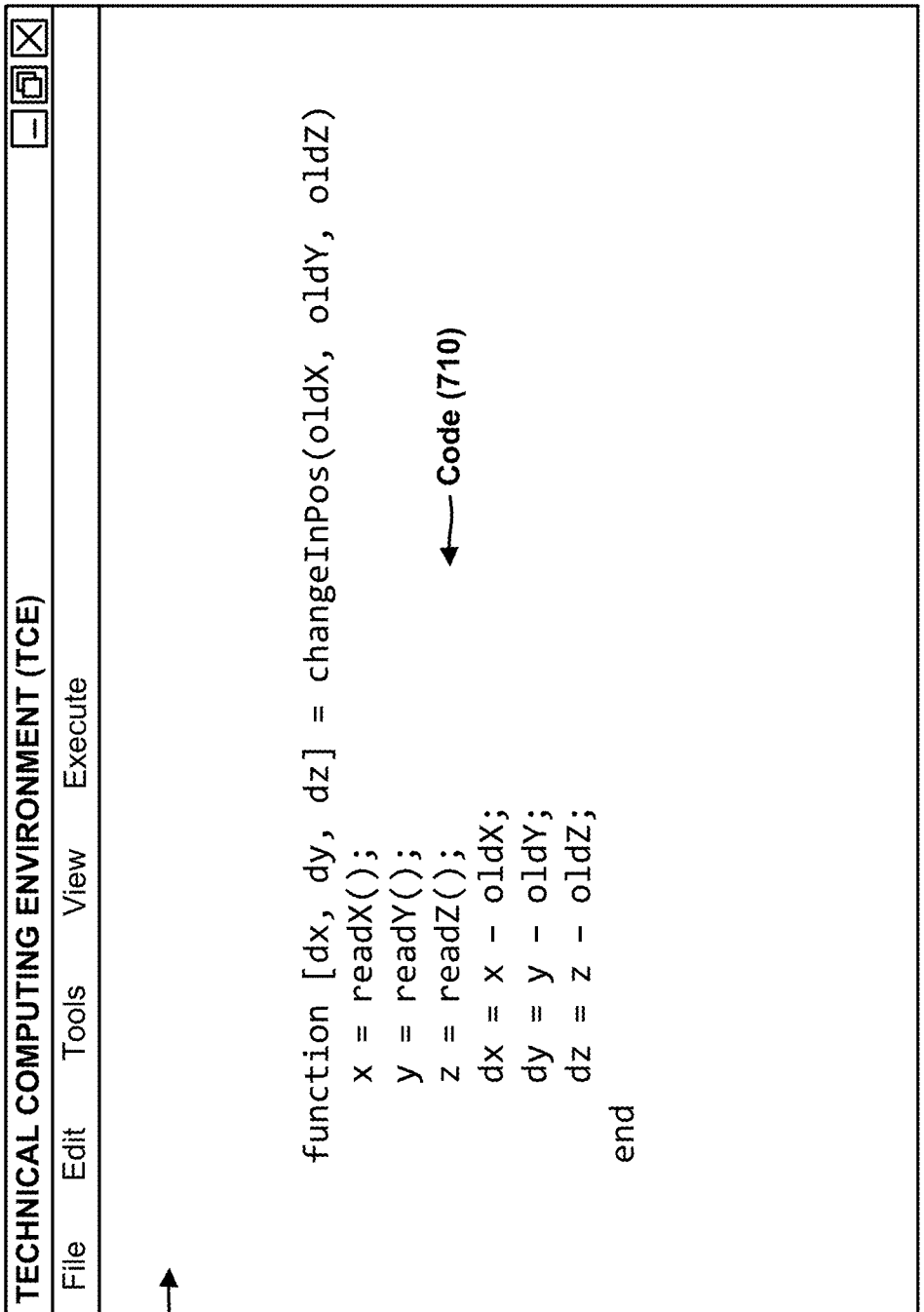

As shown in a user interface 705 of FIG. 7A, assume that client device 210 receives code 710 from a storage device (e.g., memory 330 and/or storage component 340, FIG. 3). In some implementations, code 710 may be stored in a data structure associated with client device 210, and client device 210 may receive code 710 by accessing the data structure. Further, assume that client device 210 utilizes TCE 220 to display code 710 in user interface 705. In example implementation 700, assume that code 710 includes a function that calculates a change in position in an x-direction, a y-direction, and a z-direction.

As shown in a user interface 715 of FIG. 7B, variables of code 710 (e.g., the variables oldX, oldY, oldZ) may be selected (e.g., via a selection mechanism, such as a mouse, a cursor, or the like), as indicated by reference number 720. When the variables of code 710 are selected, client device 210 (e.g., via TCE 220) may display a message 725 (e.g., a context message, a tooltip message, or the like) that includes an instruction to select "Enter" to group the selected variables (e.g., oldX, oldY, oldZ) together. If "Enter" is selected in response to message 725, client device 210 (e.g., via TCE 220) may analyze the selected variables to determine that the selected variables are compatible (e.g., compatible dimensions, compatible data types, or the like). In some implementations, an affordance may be presented that allows a user to configure how syntax should be changed (e.g., what kind of structured data type should be used, what its name should be, or the like).

If client device 210 determines that the selected variables are compatible, and as shown in a user interface 730 of FIG. 7C, client device 210 may combine the selected variables into a single variable 735 (e.g., sIn). Client device 210 may change additional syntax of code 710 if client device 210 determines that the selected variables are compatible. For example, client device 210 may change the syntax dx=x−oldX to dx=x−sIn.oldX, as indicated by reference number 740; may change the syntax dy=y−oldY to dy=y−sIn.oldY, as indicated by reference number 745; and may change the syntax dz=z−oldZ to dz=z−sIn.oldZ, as indicated by reference number 750.

Figure 7D:
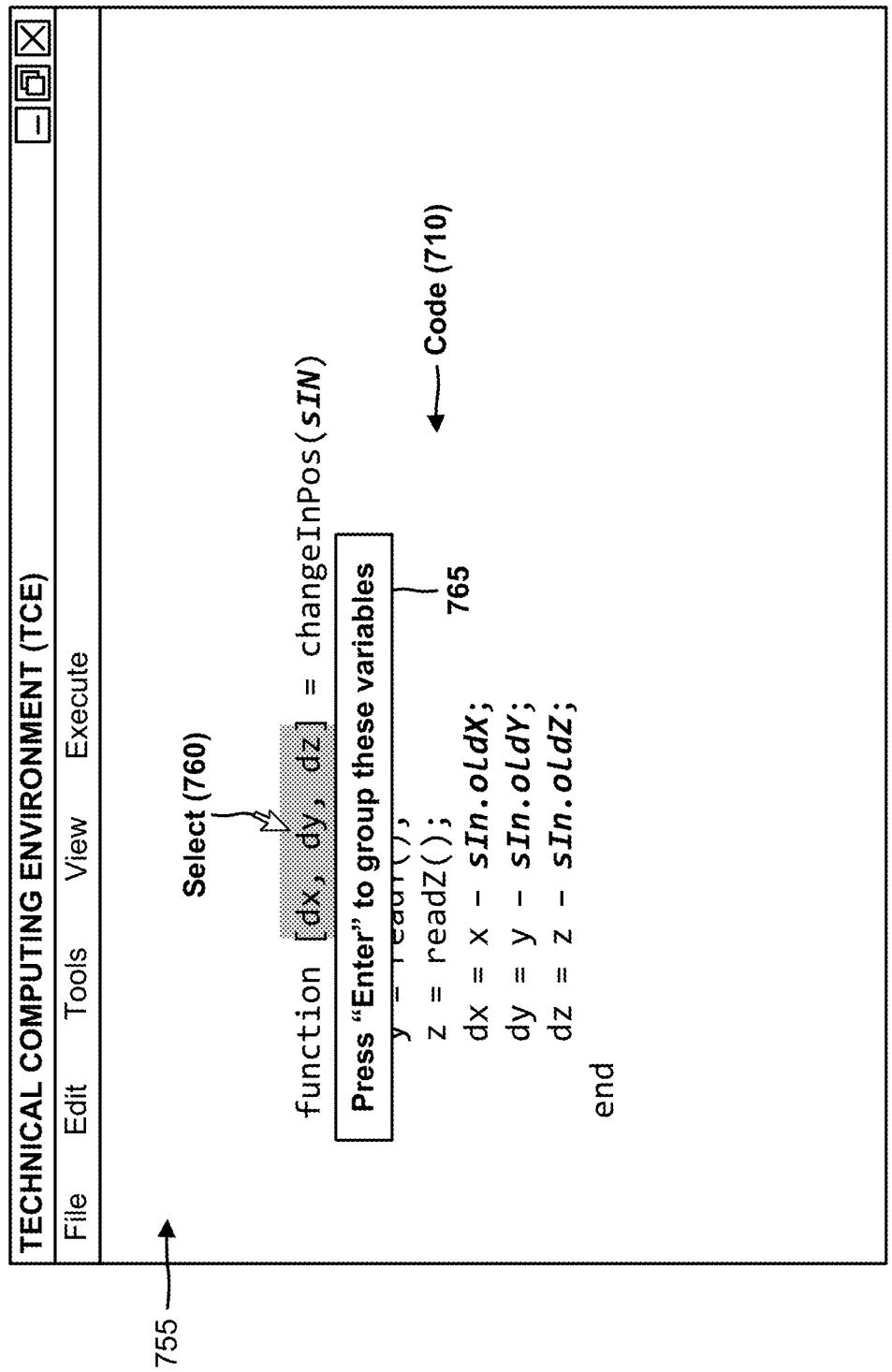

As shown in a user interface 755 of FIG. 7D, other variables of code 710 (e.g., the variables dx, dy, dz) may be selected (e.g., via a selection mechanism, such as a mouse, a cursor, or the like), as indicated by reference number 760. When the other variables of code 710 are selected, client device 210 (e.g., via TCE 220) may display a message 765 (e.g., a context message, a tooltip message, or the like) that includes an instruction to select "Enter" to group the selected other variables (e.g., dx, dy, dz) together. If "Enter" is selected in response to message 765, client device 210 (e.g., via TCE 220) may analyze the selected other variables to determine that the selected other variables are compatible (e.g., compatible dimensions, compatible data types, or the like).

If client device 210 determines that the selected other variables are compatible, and as shown in a user interface 770 of FIG. 7E, client device 210 may combine the selected other variables into a single variable 775 (e.g., sOut). Client device 210 may also change additional syntax of code 710 if client device 210 determines that the selected other variables are compatible. For example, client device 210 may change the syntax dx=x−sIn.oldX to sOut.dx=x−sIn.oldX, as indicated by reference number 780; may change the syntax dy=y−sIn.oldY to sOut.dy=y−sIn.oldY, as indicated by reference number 785; and may change the syntax dz=z−sIn.oldZ to sOut.dz=z−sIn.oldZ, as indicated by reference number 790. Such an arrangement may enable variables to be quickly and easily grouped together with a single construct.

FIG. 8 is a flow chart of an example process 800 for automatically grouping signals of a model into a semantically viable aggregation. In some implementations, one or more process blocks of FIG. 8 may be performed by client device 210. In some implementations, one or more process blocks of FIG. 8 may be performed by another device or a group of devices separate from or including client device 210, such as server device 230.

As shown in FIG. 8, process 800 may include receiving a selection of signals associated with a model (block 810). For example, client device 210 (e.g., via TCE 220) may create and/or receive a model. In some implementations, client device 210 may receive the model from a storage device (e.g., memory 330 and/or storage component 340, FIG. 3). In some implementations, client device 210 (e.g., TCE 220) may receive the model based on a user creating the model. For example, a user may cause client device 210 to create or open a user interface. One or more model elements may be added to the user interface to create the model. For example, in some implementations, client device 210 may receive a command, from the user, that indicates that a model element is to be added to the user interface. Client device 210 may receive the command based, for example, on detecting a selection of a particular menu item, entry of a particular textual or audible input from the user, and/or entry of some other predetermined input that indicates a desire to add a model element to the user interface. As another example, client device 210 may receive an input (e.g., a drag and drop) that indicates that a model element, included in a model element library associated with TCE 220, is to be added to the user interface. Based on the command, client device 210 may add the model element to the user interface.

In some implementations, as described above in connection with FIG. 4A, the model may include one or more blocks and/or signals 410, such as a clock block that generates a clock signal, a ground block that generates a ground signal, and a sine wave block that generates a sine wave signal. In such implementations, signals 410 may be selected (e.g., via a selection mechanism, such as a mouse, a cursor, or the like) by enclosing signals 410 within selection box 415.

In some implementations, one or more blocks and/or signals may be selected by enclosing the blocks/signals in a boundary (e.g., a circle, a square, a box, or the like). In some implementations, the blocks/signals may be selected individually. In some implementations, the blocks/signals may be selected automatically by analyzing the model and selecting the blocks/signals based on the analysis of the model.

As further shown in FIG. 8, process 800 may include analyzing the selected signals to identify signals that can be grouped into a semantically viable aggregation (block 820). For example, as described above in connection with FIG. 4A, before displaying the toolkit menu, client device 210 (e.g., via TCE 220) may analyze signals 410 to identify signals that can be grouped into a semantically viable aggregation (e.g., are at least two unconnected signals, of signals 410, that are compatible). In some implementations, client device 210 may determine that signals 410 can be grouped into a semantically viable aggregation (e.g., are compatible) when two or more of signals 410 are not already grouped together. In some implementations, client device 210 may determine that signals 410 can be grouped into a semantically viable aggregation (e.g., are compatible) when two or more of signals 410 are not already connected to any other blocks. In some implementations, client device 210 may determine that two or more of signals 410 can be grouped into a semantically viable aggregation (e.g., compatible) when two or more of signals 410 include the same or similar dimensions, conditions, data, data types (e.g., integers, doubles, or the like), sample times, properties, semantics, messages (e.g., data and function calls), user-defined criteria, or the like. For example, if signals 410 include a first signal with a numeric value, a second signal with a character, and a third signal with a numeric value, client device 210 may determine that the first signal and the third signal are compatible. Client device 210 may also determine that the second signal is incompatible with the first signal and the third signal. In such an example, client device 210 may exclude the second signal from the bus, or possibly another type of aggregation based on implementation, eventually created by client device 210.

As further shown in FIG. 8, process 800 may include receiving an instruction to group the selected signals into a semantically viable aggregation, e.g., a bus, a message, or the like, (block 830). For example, as described above in connection with FIG. 4A, when signals 410 are enclosed within selection box 415, toolkit menu 420 may be displayed and may include various tools for manipulating signals 410. In some implementations, toolkit menu 420 may include a create bus tool for automatically creating a bus for signals 410. When the create bus tool is selected (e.g., via the selection mechanism) from toolkit menu 420, client device 210 (e.g., via TCE 220) may receive an instruction to create a bus for signals 410.

In some implementations, when the signals are selected, a window may be displayed and may include information requesting whether the selected signals are to be grouped in an aggregation, e.g., a bus, a message or the like, and may include information requesting the type of the aggregation. In some implementations, client device 210 (e.g., via TCE 220) may inspect the model and/or the selection, and may identify which signals are candidates to be grouped in an aggregation based on the inspection, and may identify the types of aggregations that are semantically viable. In such implementations, client device 210 may display a menu, a window, or the like, that indicates which signals are candidates for grouping in an aggregation and requests whether an aggregation(s) are to be created for the candidate signals, and may request the type of the aggregation(s). In some implementations, the toolkit menu and/or the create bus tool may be continuously displayed in TCE 220, and may become highlighted (e.g., change color, flash, change font style, or the like) when the signals are selected. In some implementations, analysis of selected signals (block 820) may be performed after receiving the instruction to group the selected signals into a semantically viable aggregation (block 830), possibly based on the type of the aggregation requested by the instruction.

In some implementations, if client device 210 determines that a semantically viable aggregation cannot be created (e.g., because there are less than two unconnected compatible signals), client device 210 (e.g., via TCE 220) may display an indicator (e.g., a warning or error message). In some implementations, client device 210 may display the indicator if one of multiple signals is incompatible with the remaining signals. In such implementations, the indicator may provide an indication as to why the one signal is incompatible (e.g., wrong data type, different semantics, or the like). In some implementations, if client device 210 determines that a semantically viable aggregation cannot be created (e.g., because there are less than two unconnected compatible signals), client device 210 may not display the tool for creating an aggregation, e.g., create bus, in the toolkit menu since a semantically viable aggregation cannot be created for such signals. In some implementations, multiple types of aggregations may be supported and client device 210 may display one or more indicators for the types of aggregations that cannot be created, or may exclude the tools for creating the types of aggregations that cannot be created.

In some implementations, client device 210 may receive an instruction to create aggregations, e.g., buses, for a model. When the instruction is received, client device 210 (e.g., via TCE 220) may automatically analyze the model to identify signals that can be grouped into a semantically viable aggregation (e.g., at least two unconnected, compatible signals) in the model. Client device 210 may display the identified signals and may request whether an aggregation(s), e.g., bus(es), message(s), or the like, may be created for the identified signals. In such implementations, client device 210 may display the proposed aggregations, e.g., bus(es), message(s), or the like, and the user may accept or reject the proposed aggregations.

As further shown in FIG. 8, process 800 may include determining an orientation of the identified signals (block 840). For example, if client device 210 determines that the selected signals can be grouped into a semantically viable aggregation, client device 210 may determine that the selected signals are oriented in a right to left orientation (←), a left to right orientation (→), a top-down orientation (↓), a bottom-up orientation (↑), or another type of orientation (e.g., diagonal). In some implementations, as described above in connection with FIG. 4A, client device 210 may determine that signals 410 are oriented to output signals from left to right. In some implementations, as described above in connection with FIG. 4C, client device 210 may determine that the output signals of subsystem block 450 are oriented to output from subsystem block 450 from left to right. In some implementations, as described above in connection with FIG. 4E, client device 210 may determine that signals 470 are oriented to output signals in a downward direction.

As further shown in FIG. 8, process 800 may include determining a total number of the identified signals (block 850). For example, if client device 210 determines that identified signals can be grouped into a semantically viable aggregation, client device 210 may determine a total number of the identified signals. In some implementations, as described above in connection with FIG. 4A, client device 210 may determine that the total number of signals 410 is three (e.g., the clock signal, the ground signal, and the sine wave signal).

As further shown in FIG. 8, process 800 may include generating a block to group the identified signals into a semantically viable aggregation with a particular number of inputs, a particular number of outputs, a particular size, a particular position, and a particular orientation based on the identified signals, their orientations, and/or their total number (block 860). For example, as described above in connection with FIG. 4B, client device 210 (e.g., via TCE 220) may automatically create a bus creator block 430 with a particular number of inputs, a particular number of outputs, a particular size, a particular position, and a particular orientation based on signals 410, the determined orientation of signals 410, and/or the total number of signals 410. In some implementations, the particular number of inputs of the bus creator block 430 may be large enough to receive signals 410, the particular number of outputs of the bus creator block may be one, the particular size of the bus creator block may be large enough to ease any user interaction that may occur at a later time, the particular position may be to the right of signals 410, and the particular orientation 435 may be left-to-right.

In some implementations, the particular number of inputs and the size of the bus creator block may be large enough to accommodate the number of the selected signals, the spacing provided between the selected signals, or the like. In some implementations, the particular position may of the bus creator block may be spaced a particular distance from the selected signals and either to the right, the left, above, or below the selected signals (e.g., depending on the direction/orientation of the selected signal). In some implementations, the particular orientation of the bus creator block may be left-to-right, right-to-left, top-to-bottom, or bottom-to-top (e.g., depending on the orientation of the selected signals).

As further shown in FIG. 8, process 800 may include providing the block in the model (block 870). For example, client device 210 (e.g., via TCE 220) may provide the block to group the identified signals into a semantically viable aggregation (e.g., the bus creator block) in the model. In some implementations, the bus creator block may be provided in the model with the particular number of inputs, the particular number of outputs, the particular size, the particular position, and the particular orientation. In some implementations, the bus creator block may be visually distinguished in the model based on color, shading, effects (e.g., flashing), or the like. In such implementations, the user may move the bus creator block, resize the bus creator block, reorient the bus creator block, or the like, or client device 210 may ask the user if the size, the position, and orientation of the bus creator block are acceptable.

As further shown in FIG. 8, process 800 may include connecting the identified signals to the block inserted to group the identified signals into a semantically viable aggregation, e.g., a bus creator block, a message block, or the like, in a particular order (block 880). For example, client device 210 (e.g., via TCE 220) may connect the identified signals to the inserted block to group the identified signals into a semantically viable aggregation (e.g., a bus creator block, a message block, or the like) in a particular order. In some implementations, as described above in connection with FIG. 4B, client device 210 may automatically connect signals 410 to bus creator block 430 in a particular order (e.g., a top-down order), as indicated by reference number 440.

In some implementations, the identified signals (e.g., that can be grouped into a semantically viable aggregation) may be grouped into a bus. In some implementations, the identified signals may include signals and function call signals, and may be grouped into messages. In some implementations, the identified signals (e.g., in a textual domain) may include individual variables and may be grouped into structure data types (e.g., records, structs, etc.). The creation of a semantically viable aggregation for the identified signals may differ from one implementation to another implementation. For example, the identified signals may be grouped using bus creator blocks, bus ports, text, modification of a file, or the like.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Systems and/or methods, described herein, may automatically create a new block to group signals of a model into a semantically viable aggregation, and may automatically group the signals of a model into a semantically viable aggregation. The systems and/or methods may reduce time, increase productivity, improve the user experience, and reduce computing resources associated with grouping multiple signals into a semantically viable aggregation. The systems and/or methods may automate various tasks for grouping multiple signals into a semantically viable aggregation, which require manual performance, and may eliminate context switches (e.g., opening a library of blocks, editing properties of the bus creator block, or the like) associated with grouping multiple signals into a semantically viable aggregation.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Code (sometimes referred to herein as program code) is to be broadly interpreted to include C++ code, Hardware Description Language (HDL) code, very-high-speed integrated circuits (VHSIC) HDL (VHDL) code, Verilog code, Java code, binary code that may be executed (e.g., executable files that may be directly executed by an operating system, bitstream files that may be used to configure an FPGA, Java byte code, object files combined together with linker directives, source code, makefiles, or the like), text files that may be executed in conjunction with other executables (e.g., Python text files, Octave files, a collection of dynamic-link library (DLL) files with text-based combining, configuration information that connects pre-compiled modules, an extensible markup language (XML) file describing module linkage, or the like), source code (e.g., readable by a human), machine code (e.g., readable by a machine), code generated using a dynamically-typed programming language (e.g., the M language, a MATLAB® language, a MATLAB-compatible language, a MATLAB-like language, or the like), or the like.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
    receiving a selection of two or more model elements associated with a model,
        the receiving the selection being performed by a device;
    analyzing the selected model elements to identify signals, associated with the selected model elements, that can be grouped into a semantically viable aggregation, and determining that there are identified signals, associated with the selected model elements, that can be grouped into a semantically viable aggregation based on semantics associated with the identified signals and their connectivity,
        the analyzing the selected model elements being performed by the device;
    receiving an instruction to group the identified signals into a semantically viable aggregation,
        the receiving the instruction being performed by the device;
    automatically providing a block, with a particular number of inputs, a particular number of outputs, a particular size, a particular position, and a particular orientation, to group the identified signals into the semantically viable aggregation,
        the providing the block being performed by the device; and
    providing a graphical representation of the block in the model rendered on a graphical user interface, with the particular size, the particular position, and the particular orientation being with respect to the graphical representation,
        the providing the graphical representation of the block in the model being performed by the device.

2. The method of claim 1, further comprising:
    determining an orientation of the identified signals;
    determining a total number of the identified signals; and
    where the generating the block includes:
        generating the block with the particular number of inputs, the particular number of outputs, the particular size, the particular position, and the particular orientation based on one or more of:
            the identified signals,
            the orientation of the identified signals, and
            the total number of the identified signals.

3. The method of claim 1, further comprising:
    connecting the identified signals to the block; and
    providing the block and the model for display.

4. The method of claim 1, where providing the block includes:
    generating the block, or modifying an existing block to provide the block.

5. The method of claim 1, where analyzing the selected model elements includes:
    identifying the identified signals, associated with the selected model elements, based on semantics associated with the identified signals and their connectivity.

6. The method of claim 1, where the identified signals are associated with an existing block of the model.

7. The method of claim 1, further comprising:
    determining a recommended orientation for the identified signals; and
    providing, for display, the recommended orientation for the identified signals.

8. The method of claim 1, where the identified signals are associated with a first block of the model and the block includes a second block of the model.

9. A non-transitory computer-readable medium for storing instructions, the instructions comprising:
    one or more instructions that, when executed by one or more processors of a device, cause the one or more processors to:
        receive a selection of two or more model elements associated with a model;
        analyze the selected model elements to determine that there are identified signals, associated with the selected model elements, that can be grouped into a semantically viable aggregation, based on semantics associated with the identified signals and their connectivity;
        provide an option to create a semantically viable aggregation;
        receive an instruction to group the identified signals into a semantically viable aggregation based on selection of the create a semantically viable aggregation option;
        automatically provide a block to group the identified signals into a semantically viable aggregation with a particular number of inputs, a particular number of outputs, a particular size, a particular position, and a particular orientation, in relation to the model, based on the identified signals; and provide a graphical representation of the block in the model rendered on a graphical user interface, with the particular size, the particular position, and the particular orientation being with respect to the graphical representation.

10. The non-transitory computer-readable medium of claim 9, where the one or more instructions, when executed by the one or more processors, further cause the one or more processors to:

determine an orientation of the identified signals that can be grouped into a semantically viable aggregation;

determine a total number of the identified signals that can be grouped into a semantically viable aggregation; and generate the block to group the identified signals into a semantically viable aggregation with the particular number of inputs, the particular number of outputs, the particular size, the particular position, and the particular orientation based on one or more of:

the identified signals that can be grouped into a semantically viable aggregation, the orientation of the identified signals that can be grouped into a semantically viable aggregation, and the total number of the identified signals that can be grouped into a semantically viable aggregation.

11. The non-transitory computer-readable medium of claim 9, where the one or more instructions, when executed by the one or more processors, further cause the one or more processors to:

connect the identified signals that can be grouped into a semantically viable aggregation to the generated block; and provide the generated block and the model for display.

12. The non-transitory computer-readable medium of claim 9, where the one or more instructions that cause the one or more processors to analyze the selected model elements, further cause the one or more processors to:

determine that there are identified signals that can be grouped into a semantically viable aggregation, of the identified signals, that are compatible based on semantics associated with the identified signals and their connectivity.

13. The non-transitory computer-readable medium of claim 9, where the identified signals are associated with an existing block of the model.

14. The non-transitory computer-readable medium of claim 9, where the one or more instructions, when executed by the one or more processors, further cause the one or more processors to:

determine a recommended orientation for the identified signals that can be grouped into a semantically viable aggregation; and provide, for display, the recommended orientation for the identified signals that can be grouped into a semantically viable aggregation.

15. The non-transitory computer-readable medium of claim 9, where the identified signals are associated with a main bus creator block of the model.

16. A device, comprising:

one or more processors to:

receive a selection of two or more model elements associated with a model;

analyze the selected model elements to determine that there are identified signals, associated with the selected model elements, that can be grouped into a semantically viable aggregation, based on semantics associated with the identified signals and their connectivity;

receive an instruction to create a block to group the identified signals into a semantically viable aggregation;

automatically provide a block to group the identified signals into a semantically viable aggregation with a particular number of inputs, a particular number of outputs, a particular size, a particular position, and a particular orientation, in relation to the model, based on the identified signals;

provide a graphical representation of the block in the model rendered on a graphical user interface, with the particular size, the particular position, and the particular orientation being with respect to the graphical representation; and connect the identified signals that can be grouped into a semantically viable aggregation to the generated block.

17. The device of claim 16, where the one or more processors are further to:

determine an orientation of the identified signals that can be grouped into a semantically viable aggregation;

determine a total number of the identified signals that can be grouped into a semantically viable aggregation; and generate the block with the particular number of inputs, the particular number of outputs, the particular size, the particular position, and the particular orientation based on:

the identified signals that can be grouped into a semantically viable aggregation, the orientation of the identified signals that can be grouped into a semantically viable aggregation, and the total number of the identified signals that can be grouped into a semantically viable aggregation.

18. The device of claim 16, where the one or more processors are further to:

determine that none of two or more unconnected signals, associated with a second selection of selected model elements, can be grouped into a semantically viable aggregation; and provide, for display, information indicating that a block to group selected signals associated with the second selection of selected model elements into a semantically viable aggregation cannot be generated since none of the unconnected signals can be grouped into a semantically viable aggregation.

19. The device of claim 16, where the identified signals are associated with a particular block of the model.

20. The device of claim 16, where the model elements are selected by selecting:

signal lines, a bus line, a bus port, a user interface affordance, or blocks with input or output ports that are not connected.

21. The device of claim 16, where the block includes a subsystem block of the model.

22. A device, comprising:

one or more processors to:

receive a selection of variables associated with code;

analyze the selected variables to determine that there are identified variables, associated with the selection, that can be grouped into a semantically viable aggregation, based on semantics associated with the identified variables and connectivity of signals associated with the identified variables;

receive an instruction to create a single variable to group the identified variables into a semantically viable aggregation;

automatically provide a single variable to group the identified variables into a semantically viable aggregation with particular syntax, based on the identified variables;

provide the single variable in the code; and render a graphical model on a graphical user interface based on the code, with the particular syntax including information defining a particular size, a particular position, and a particular orientation, with respect to the graphical representation, of a graphical representation of a model block associated with the single variable.

23. The method of claim 1, where the selected model elements include: (1) two or more blocks, (2) two or more signals, or (3) at least one block and at least one signal.

24. The method of claim 23, where the identified signals comprise at least one of: (1) an unconnected output signal in the received selection, or (2) an output signal provided from an unconnected output port of a block in the received selection.

25. The method of claim 1, where the block comprises a bus selector block, a bus input port, or a bus output port.

26. The method of claim 1, where the grouped identified signals are accessible by or generated from first blocks of a subsystem, and the method comprises replacing the first blocks of the subsystem with an input block or an output block inside the subsystem.

27. The non-transitory computer-readable medium of claim 9, where the block comprises a bus selector block, a bus input port, or a bus output port.

28. The non-transitory computer-readable medium of claim 9, where the grouped identified signals are accessible by or generated from first blocks of a subsystem, and the instructions comprise one or more instructions that, when executed by one or more processors of the device, cause the one or more processors to replace the first blocks of the subsystem with an input block or an output block inside the subsystem.

29. The device of claim 16, where the block comprises a bus selector block, a bus input port, or a bus output port.

30. The device of claim 16, where the grouped identified signals are accessible by or generated from first blocks of a subsystem, and the one or more processors replace the first blocks of the subsystem with an input block or an output block inside the subsystem.

31. The device of claim 22, where the block comprises a bus selector block, a bus input port, or a bus output port.

32. The device of claim 22, where the grouped identified signals are accessible by or generated from first blocks of a subsystem, and the one or more processors replace the first blocks of the subsystem with an input block or an output block inside the subsystem.

* * * * *